US012647127B1

(12) United States Patent
Fazeel et al.

(10) Patent No.: US 12,647,127 B1
(45) Date of Patent: Jun. 2, 2026

(54) SAMPLER CIRCUIT WITH LOW DEADBAND ACROSS PROCESS, VOLTAGE, AND TEMPERATURE

(71) Applicant: Cadence Design Systems, Inc., San Jose, CA (US)

(72) Inventors: Hajee Mohammed Shuaeb Fazeel, Bengaluru (IN); Vinod Kumar, Uttar Pradesh (IN); Thomas Evan Wilson, Laurel, MD (US)

(73) Assignee: Cadence Design Systems, Inc., San Jose, CA (US)

( * ) Notice: Subject to any disclaimer, the term of this patent is extended or adjusted under 35 U.S.C. 154(b) by 127 days.

(21) Appl. No.: 18/750,057

(22) Filed: Jun. 21, 2024

(51) Int. Cl.
| | |
|---|---|
| *H03M 1/74* | (2006.01) |
| *H03F 3/45* | (2006.01) |
| *H03M 1/00* | (2006.01) |

(52) U.S. Cl.
CPC ........ *H03M 1/742* (2013.01); *H03F 3/45475* (2013.01); *H03M 1/002* (2013.01); *H03F 2200/261* (2013.01)

(58) Field of Classification Search
CPC ............ H03M 1/00; H03M 1/45; H03M 1/74; H03M 1/742; H03M 1/261; H03M 1/002; H03M 1/45475
See application file for complete search history.

(56) References Cited

U.S. PATENT DOCUMENTS

| | | | | | |
|---|---|---|---|---|---|
| 5,382,916 | A * | 1/1995 | King | .................... | H03G 1/0082 |
| | | | | | 330/253 |
| 5,994,755 | A * | 11/1999 | DeJong | ................... | G05F 3/262 |
| | | | | | 257/500 |
| 6,396,329 | B1 * | 5/2002 | Zerbe | ................... | G11C 7/1084 |
| | | | | | 327/333 |
| 6,448,851 | B1 * | 9/2002 | McIntosh | ............... | H03F 1/301 |
| | | | | | 327/307 |
| 6,603,356 | B1 * | 8/2003 | Kim | ........................ | H03F 1/308 |
| | | | | | 330/265 |
| 6,965,262 | B2 * | 11/2005 | Zerbe | ................... | H03K 17/162 |
| | | | | | 327/51 |
| 7,626,442 | B2 * | 12/2009 | Zerbe | ................... | H04L 7/0331 |
| | | | | | 327/374 |
| 10,498,305 | B2 * | 12/2019 | Tajalli | ................ | H04L 25/0272 |

(Continued)

*Primary Examiner* — Lam T Mai
(74) *Attorney, Agent, or Firm* — Mark H. Whittenberger; Holland & Knight LLP

(57) ABSTRACT

Embodiments included herein are directed towards a sampler circuit. Embodiments may include a first positive-channel metal oxide semiconductor (PMOS) or negative-channel metal oxide semiconductor (NMOS) transistor that may be operatively connected to a voltage source and a first output node. A cross-coupled PMOS/NMOS pair may be operatively connected to the first PMOS/NMOS transistor, respectively, and a pair of first stage output nodes may be operatively connected to the cross-coupled PMOS/NMOS pair, respectively, where the pair of first stage output nodes may include a positive node and a negative node. An input differential pair may be operatively connected to the pair of first stage output nodes, and an offset current digital-to-analog converter (DAC) may be operatively connected to a first side of the input differential pair, while an offset current DAC replica may be operatively connected to a second side of the input differential pair.

23 Claims, 11 Drawing Sheets

(56)                    References Cited

U.S. PATENT DOCUMENTS

| | | | |
|---|---|---|---|
| 10,530,377 B1 * | 1/2020 | Zhang | H03M 1/1061 |
| 2003/0132872 A1 * | 7/2003 | Casper | H03F 3/45183 |
| | | | 341/161 |
| 2008/0218267 A1 * | 9/2008 | Taylor | H03F 3/4565 |
| | | | 330/259 |
| 2009/0251191 A1 * | 10/2009 | Li | H03K 5/08 |
| | | | 327/309 |
| 2013/0293301 A1 * | 11/2013 | Eyssa | H03F 3/45071 |
| | | | 330/253 |
| 2014/0266830 A1 * | 9/2014 | Song | H03M 1/74 |
| | | | 341/144 |
| 2015/0043681 A1 * | 2/2015 | Mandal | G11C 27/026 |
| | | | 375/340 |
| 2015/0244355 A1 * | 8/2015 | Venkiteswaran | |
| | | | H03K 3/356165 |
| | | | 341/161 |
| 2025/0357940 A1 * | 11/2025 | Upadhyaya | H03M 1/0607 |

* cited by examiner

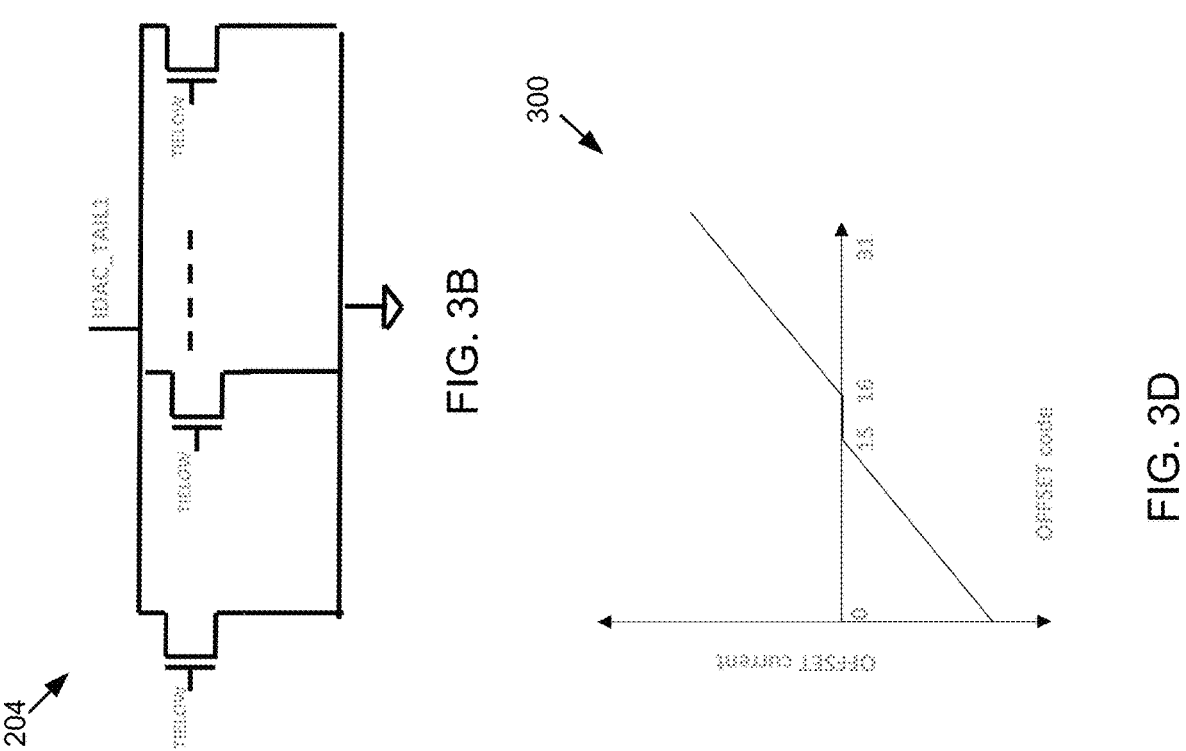
FIG. 3B
FIG. 3D
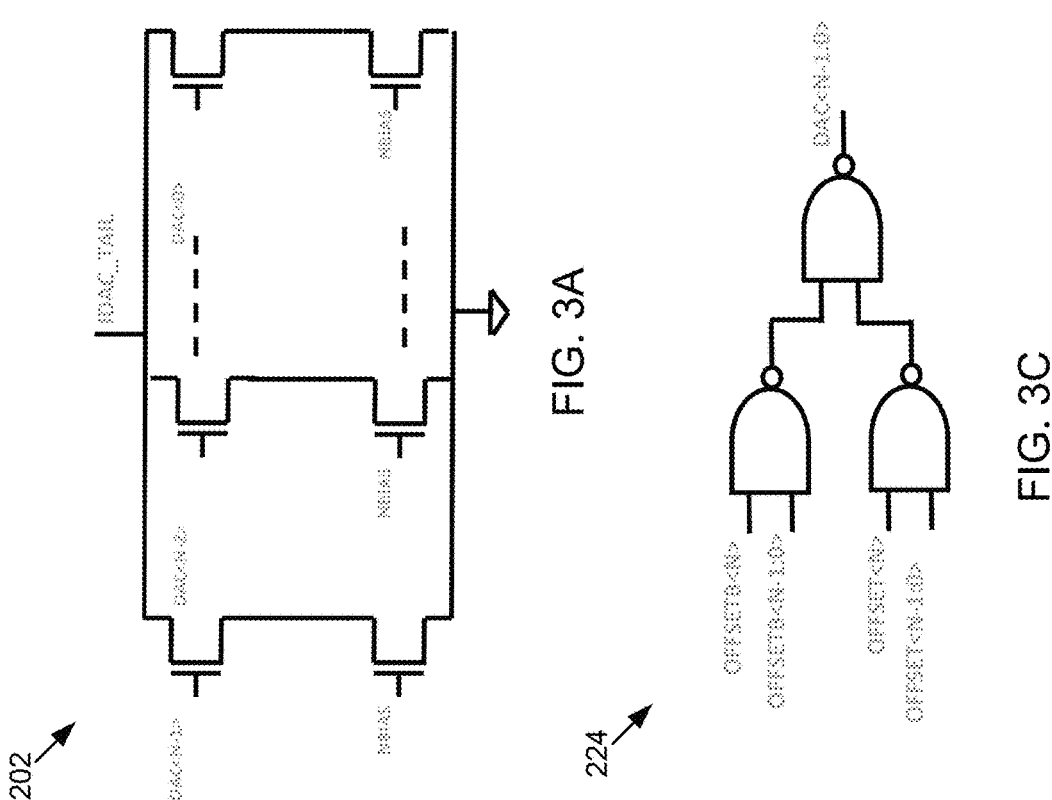
FIG. 3A
FIG. 3C

602

604

624

700

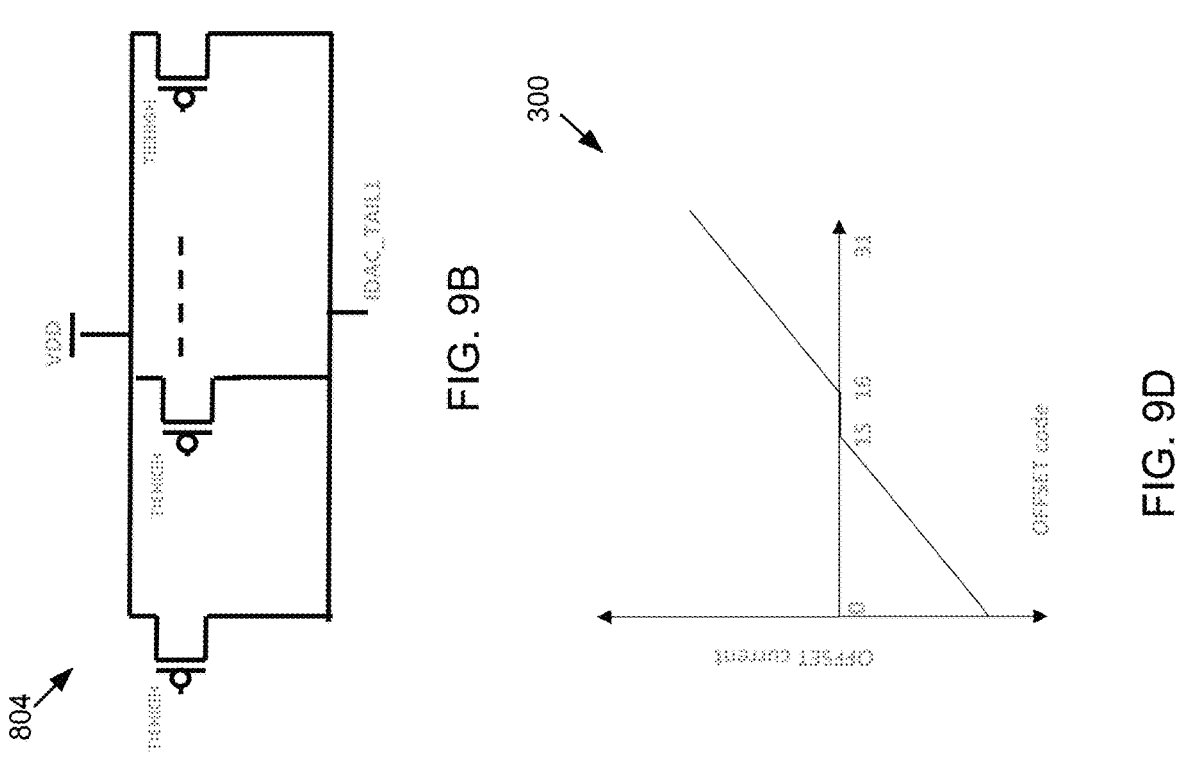
FIG. 9B
FIG. 9D
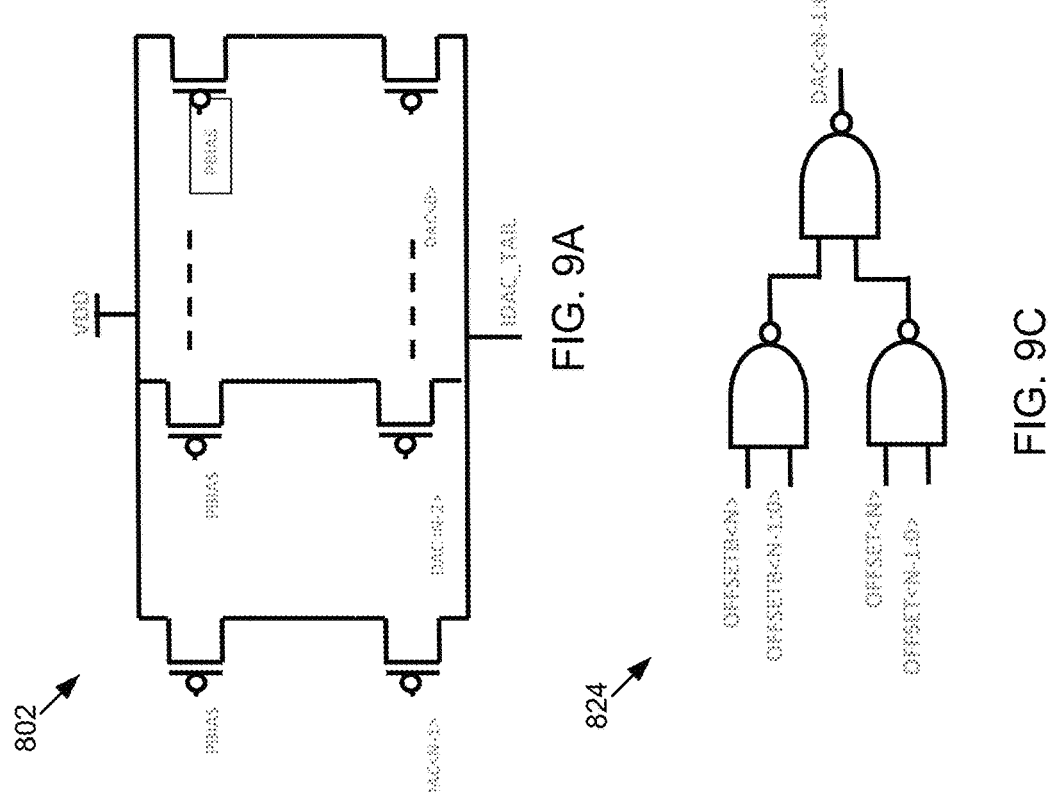
FIG. 9A
FIG. 9C

SAMPLER CIRCUIT WITH LOW DEADBAND ACROSS PROCESS, VOLTAGE, AND TEMPERATURE

FIELD OF THE INVENTION

The present disclosure relates to sampler circuits, and more particularly, to sampler circuits capable of servicing higher bandwidth applications using the high speed graphics double data rate 7 (GDDR7) protocols with speeds of up to 48 Gbps.

BACKGROUND

As a result of the recently released GDDR7 high-speed protocol, there has been an increased demand for sampler circuits that may be capable of achieving higher bandwidth per pin for applications such as data servers, artificial intelligence, high speed graphics, and machine learning. The GDDR7 protocol may use pulse-amplitude modulation 3 (PAM3), which is a signaling method that may use three signal levels to encode words. As the data rate for the GDDR7 interface approaches 48 Gbps and beyond, one of the key challenges may be designing system-on-chip (SOC) receivers with efficient power performance and area (PPA) metrics. This may represent a challenge because GDDR7 chips use a single-ended input with high voltage noise, and therefore need to operate at very low power.

In operation, the data traffic in GDDR7 interfaces may not be easily or accurately predicted. As a result, using GDDR7 interfaces may be unsuitable for continuous offset adaptation (training) or for the periodic calibration used in peripheral component interconnect express (PCIe) and other similar systems, where PCIe is a high-speed bus standard that allows for point-to-point data transfer between electronic components.

Sampler circuits may be a critical component of SOC receivers with efficient PPA metrics, and the sensitivity of sampler circuits may decide the gain required from corresponding preamplifier circuits, because sampler circuits with higher sensitivity may be used to enable receiver preamplifiers with lower gain stages, which may reduce area and power requirements for the receiver.

Therefore, there may be a need to design a sampler circuit with higher sensitivity and a lower deadband range. Higher sensitivity may be desirable, because it may allow the sampler to detect low input amplitudes with minimum timing loss across process, voltage, and temperature drift without adding significant power consumption. The lower deadband range may be desirable, because in the deadband zone, the sampler circuit may be unlikely to give a valid output and more likely to output an error. So reducing the deadband range may reduce the instance of errors.

SUMMARY

In one or more embodiments of the present disclosure, a sampler circuit is provided. The sampler circuit may include a first positive-channel metal oxide semiconductor (PMOS) or negative-channel metal oxide semiconductor (NMOS) transistor operatively connected to a voltage source and a first output node. A cross-coupled PMOS/NMOS pair may be operatively connected to the first PMOS/NMOS transistor, respectively, and a pair of first stage output nodes may be operatively connected to the cross-coupled PMOS/NMOS pair, respectively, where the pair of first stage output nodes may include a positive node and a negative node. An input differential pair may be operatively connected to the pair of first stage output nodes, and an offset current digital-to-analog converter (DAC) may be operatively connected to a first side of the input differential pair. The sampler may further include an offset current DAC replica operatively connected to a second side of the input differential pair.

One or more of the following features may be included. The pair of first-stage output nodes may be configured to be charged to a voltage level equal to the voltage source when a clock signal may be zero and the sampler circuit may be in a precharge state. The offset current DAC and the offset current DAC replica may be connected to ground/a voltage source, respectively. The cross-coupled PMOS/NMOS pair may be connected to a pair of cross-coupled NOR/NAND gates including a first NOR/NAND gate and a second NOR/NAND gate, respectively, such that the first NOR/NAND gate may take the positive output node of the pair of first stage output nodes and an output of the second NOR/NAND gate as inputs and the second NOR/NAND gate may take the negative output node of the pair of first stage output nodes and an output of the first NOR/NAND gate as inputs, respectively. An OR/AND gate may be configured to use the output of the first NOR/NAND gate and the output of the second NOR/NAND gate as inputs, respectively, where the first output node may mirror the output of the OR/AND gate, such that the first output node may be configured to rise to 1/fall to 0 and switch off the first PMOS/NAND transistor after a delay, respectively. The pair of first stage output nodes may be configured to discharge when a clock signal transitions from 0 to 1, such that whichever of the positive output node or the negative output node of the pair of first stage output nodes discharges faster may determine the output of the first output node, and where the input differential pair may be configured to control the rate of discharge of the positive output node and the negative output node of the pair of first stage output nodes. The offset current DAC may include a first set of switches configured to introduce an offset that cancels an input referred offset, and where a most significant bit (MSB) of an offset code may be configured to control the input differential pair to determine which node of the positive output node or the negative output node of the pair of first stage output nodes may receive an offset current. The offset current DAC replica may include a second set of switches identical to the first set of switches in the offset current DAC, and where the second set of switches may be in an OFF position, such that the output of the offset current DAC replica and the output of the offset current DAC may provide the positive output node and the negative output node of the pair of first stage output nodes with the same capacitive load.

In one or more embodiments of the present disclosure, a sampler circuit is provided. The sampler circuit may include a first positive-channel metal oxide semiconductor (PMOS)/negative-channel metal oxide semiconductor (NMOS) transistor operatively connected to a voltage source and a first output node. A cross-coupled PMOS/NMOS pair may be operatively connected to the first PMOS/NMOS transistor, and a pair of first stage output nodes may be operatively connected to the cross-coupled PMOS/NMOS pair, respectively, where the pair of first stage output nodes may include a positive node and a negative node. An input differential pair may be operatively connected to the pair of first stage output nodes, and a first offset capacitive digital-to-analog converter (CAPDAC) may be operatively connected to the positive node. The sampler circuit may further include a second offset CAPDAC operatively connected to the negative node.

One or more of the following features may be included. The pair of first-stage output nodes may be configured to be charged to a voltage level equal to the voltage source when a clock signal may be zero and the sampler circuit may be in a precharge state. The first offset CAPDAC and the second offset CAPDAC may be connected to ground/a voltage source, respectively. The cross-coupled PMOS/NMOS pair may be connected to a pair of cross-coupled NOR/NAND gates including a first NOR/NAND gate and a second NOR/NAND gate, respectively, such that the first NOR/NAND gate may take the positive output node of the pair of first stage output nodes and an output of the second NOR/NAND gate as inputs and the second NOR/NAND gate may take the negative output node of the pair of first stage output nodes and an output of the first NOR/NAND gate as inputs, respectively. An OR/AND gate may be configured to take the output of the first NOR/NAND gate and the output of the second NOR/NAND gate as inputs, where the first output node may mirror the output of the OR/AND gate, such that the first output node may be configured to rise to 1/fall to 0 and switch off the first PMOS/NMOS transistor after a delay, respectively. The pair of first stage output nodes may be configured to discharge when a clock signal transitions from 0 to 1, such that whichever of the positive output node or the negative output node of the pair of first stage output nodes discharges faster may determine the output of the first output node, where the input differential pair may be configured to control the rate of discharge of the positive output node and the negative output node of the pair of first stage output nodes. Both the first and the second offset CAPDACs may be configured to receive an N-bit offset code, and both the first and the second offset CAPDACs may be in an OFF state when receiving mid-codes $[(2^{(N-1)}-1]$ and $2^{(N-1)}$. A capacitance of the positive/negative output node of the pair of first stage output nodes may be increased and a capacitance of the negative/positive output node of the pair of first stage output nodes may be in an OFF state, respectively, when receiving codes $[(2^{(N-1)})-1]$ to 0 of the N-bit offset code, and where a capacitance of the negative/positive output node of the pair of first stage output nodes may be increased and a capacitance of the positive/negative output node of the pair of first stage output nodes may be in an OFF state, respectively, when receiving codes $2^{(N-1)}$ to $[(2^N)-1]$ of the N-bit offset code.

In one or more embodiments of the present disclosure, a sampler circuit is provided. The sampler circuit may include a first positive-channel metal oxide semiconductor (PMOS)/negative-channel metal oxide semiconductor (NMOS) transistor operatively connected to a voltage source and a first output node. A cross-coupled PMOS/NMOS pair may be operatively connected to the first PMOS/NMOS transistor, respectively. A pair of first stage output nodes may be operatively connected to the cross-coupled PMOS/NMOS pair, respectively, where the pair of first stage output nodes may include a positive node and a negative node. An input differential pair may be operatively connected to the pair of first stage output nodes, and a first offset current digital-to-analog converter (DAC) may be operatively connected to the positive node. The sampler circuit may further include a second offset DAC operatively connected to the negative node.

One or more of the following features may be included. The pair of first-stage output nodes may be configured to be charged to a voltage level equal to the voltage source when a clock signal may be zero and the sampler circuit may be in a precharge state. The first offset current DAC and the second offset current DAC may be connected to ground/a voltage source, respectively. The cross-coupled PMOS/NMOS pair may be connected to a pair of cross-coupled NOR/NAND gates including a first NOR/NAND gate and a second NOR/NAND gate, respectively, such that the first NOR/NAND gate may take the positive output node of the pair of first stage output nodes and an output of the second NOR/NAND gate as inputs and the second NOR/NAND gate may take the negative output node of the pair of first stage output nodes and an output of the first NOR/NAND gate as inputs, respectively. An OR/AND gate may be configured to take the output of the first NOR/NAND gate and the output of the second NOR/NAND gate as inputs, respectively, where the first output node may mirror the output of the OR/AND gate, such that the first output node may be configured to rise to 1/fall to 0 and switch off the first PMOS/NMOS transistor after a delay, respectively, and where the pair of first stage output nodes may be configured to discharge when a clock signal transitions from 0 to 1, and whichever of the positive output node or the negative output node of the pair of first stage output nodes discharges faster may determine the output of the first output node, where the input differential pair may be configured to control the rate of discharge of the positive output node and the negative output node of the pair of first stage output nodes. Both the first and the second offset current DACs may be configured to receive an N-bit offset code, and both the first and the second offset current DACs may be in an OFF state when receiving mid-codes $[(2^{(N-1)})-1]$ and $2^{(N-1)}$. The first offset current DAC operatively connected to the positive output node of the pair of first stage output nodes may be in an OFF/ON state and the second offset current DAC operatively connected to the negative output node of the pair of first stage output nodes may be in an ON/OFF state when receiving codes $[(2^{(N-1)})-1]$ to 0 of the N-bit offset code, respectively, and where the second offset current DAC operatively connected to the negative output node of the pair of first stage output nodes may be in an OFF/ON state and the first offset current DAC operatively connected to the positive output node of the pair of first stage output nodes may be in an ON/OFF state when receiving codes $2^{(N-1)}$ to $[(2^N)-1]$ of the N-bit offset code, respectively.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

FIG. 3A shows a topology of an offset current DAC circuit consistent with the embodiment shown in FIG. 2;

FIG. 3B shows a topology of an offset current DAC replica circuit consistent with the embodiment shown in FIG. 2;

FIG. 3C shows a topology of an offset control logic consistent with the embodiment shown in FIG. 2;

FIG. 3D shows a graph of an offset current with respect to an offset code consistent with the embodiment shown in FIG. 2;

FIG. 9A shows a topology of an offset current DAC circuit consistent with the embodiment shown in FIG. 8;

FIG. 9B shows a topology of an offset current DAC replica circuit consistent with the embodiment shown in FIG. 8;

FIG. 9C shows a topology of an offset control logic consistent with the embodiment shown in FIG. 8;

FIG. 9D shows a graph of an offset current with respect to an offset code consistent with the embodiment shown in FIG. 8;

DETAILED DESCRIPTION

Figure 1:
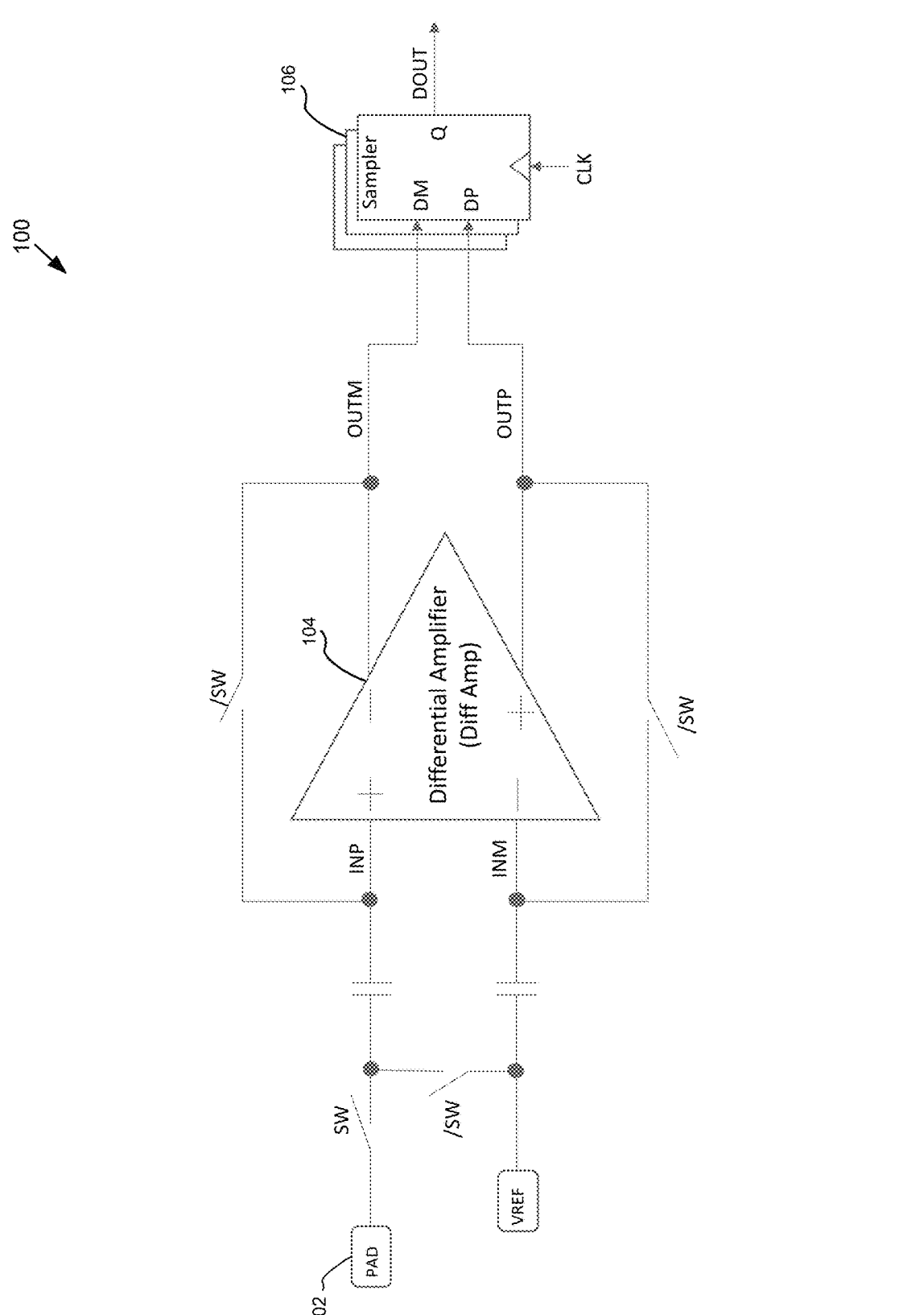
FIG. 1 shows a topology of a GDDR7 receiver circuit consistent with embodiments of the present disclosure.

Reference will now be made in detail to the embodiments of the present disclosure, examples of which are illustrated in the accompanying drawings. The present disclosure may, however, be embodied in many different forms and should not be construed as being limited to the embodiments set forth herein; rather, these embodiments are provided so that this disclosure will be thorough and complete, and will fully convey the concept of the present disclosure to those skilled in the art. Like reference numerals in the drawings denote like elements.

As used in any embodiment described herein, "circuit" or "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

As a result of the recently released graphics double data rate 7 (GDDR7) high speed protocol, there has been an increased demand for sampler circuits that may be capable of achieving higher bandwidth per pin for applications such as data servers, artificial intelligence, high speed graphics, and machine learning. The GDDR7 protocol may use pulse-amplitude modulation 3 (PAM3), which may be a signaling method that may use three signal levels to encode words. As the data rate for the GDDR7 interface approaches 48 Gbps and beyond, one of the key challenges may be designing system-on-chip (SOC) receivers with efficient power performance and area (PPA) metrics. This may represent a challenge because GDDR7 chips use a single-ended input with high voltage noise, and therefore need to operate at very low power.

In operation, the data traffic in GDDR7 interfaces may not be easily or accurately predicted. As a result, using GDDR7 interfaces may be unsuitable for continuous offset adaptation (training) or for the periodic calibration used in peripheral component interconnect express (PCIe) and other similar systems, where PCIe may be a high-speed bus standard that allows for point-to-point data transfer between electronic components.

Sampler circuits may be a critical component of SOC receivers with efficient power performance and area (PPA) metrics, and the sensitivity of sampler circuits may decide the gain required from corresponding preamplifier circuits because sampler circuits with higher sensitivity may be used to enable receiver preamplifiers with lower gain stages, which may reduce area and power requirements for the receiver.

Therefore, there may be a need to design a lower dead-band higher sensitivity sampler circuit that may detect low input amplitudes with minimum timing loss across process, voltage, and temperature drift and without adding significant power consumption.

Referring now to FIG. 1, a topology of a GDDR7 receiver circuit 100 consistent with embodiments of the present disclosure is provided. A signal at the peripheral access device (PAD) 102 may be level-shifted from the input/output domain to the core domain by using a capacitively coupled autozero-based receiver structure. This level-shifted signal may be amplified by a differential amplifier 104 and fed to a clocked sampler 106. GDDR7 receiver 100 may have a quarter rate clocking architecture, which may enforce four current samplers corresponding to 0°, 90°, 180° and 270° phases. GDDR7 receiver 100 may have clock and data recovery (CDR) locking, which may be a process that may reduce jitter from a high-speed input to a high-speed output by locking an internal voltage controlled oscillator (VCO) to the incoming data. Here, CDR locking may be used to enforce four more Q samplers, and thus, each preamplifier may have a total of 8 samplers 106 as load on an output for amplifier 104. Further, there may be 3 preamplifiers in each receiver. Two preamplifiers may be used for a low reference voltage (VREFL) and a high reference voltage (VREFH) of pulse-amplitude modulation 3 (PAM3) signaling method and the third preamplifier may be used for periodic replacement in an autozero architecture. Thus, GDDR7 receiver 100 may have a total of 24 sampler circuits like clocked sampler 106.

In some embodiments, the sampler deadband may be the zone between the setup and hold time of the sampler for which the sampler circuit may not give a valid output. This deadband zone may subtract directly from the read path timing margin, and may generally be held to low values across process, temperature, and voltage. Having continuous offset adaptation (periodic offset calibration) for the sampler circuit may disrupt data traffic and reduce system bandwidth. Therefore, the sampler circuit may need to be able to detect data with low deadband across voltage and temperature drift without periodic offset calibration.

The input differential pair of the sampler circuit may decide the input referred offset of the sampler, where the input referred offset may be the ratio of the output voltage to the sampler gain. More specifically, the input referred offset may represent the differential voltage needed between the inputs of an amplifier to make the output zero. However, in practice, samplers may not have exactly matched differential input transistors due to imprecise manufacturing processes, which may cause the output to be zero at a non-zero value of the differential input. This difference may be called input referred offset and may appear as an output voltage deviation from the ideal value. This input differential pair of the sampler circuit may present a capacitive load to the amplifier, and since each preamplifier may have 8 samplers, this capacitive load may be multiplied by 8×. Thus, the size of the input differential pair of the sampler circuit may be constrained by the capacitive load that the preamplifier may be capable of driving, and since each receiver may need 24 sampler circuits the area and power consumption of each sampler circuit may need to be very small to make it usable for GDDR interfaces where multiple signals may be transmitted in parallel.

Figure 2:
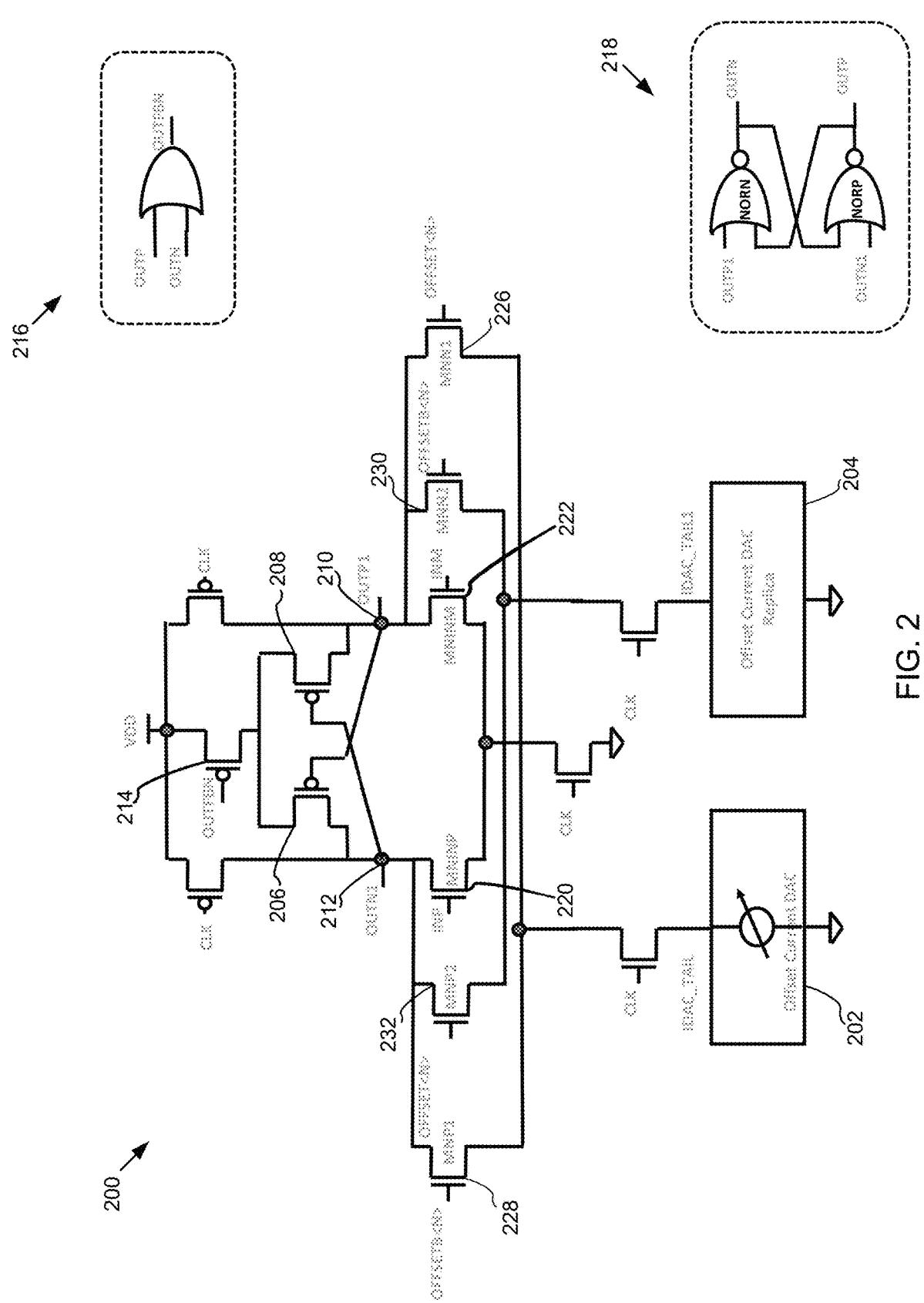
FIG. 2 shows a topology of a sampler circuit using an offset current DAC and an offset current DAC replica consistent with embodiments of the present disclosure.

Referring now to FIG. 2, a topology of a sampler circuit 200 using an offset current DAC 202 and an offset current DAC replica 204 consistent with embodiments of the present disclosure is provided. A pair of cross-coupled PMOS transistors 206, 208 may drain to a pair of first stage output nodes 210, 212 ($OUT_{P1}$ and $OUT_{N1}$) of sampler circuit 200. A voltage source ($V_{DD}$) of cross-coupled PMOS transistors 206, 208 may be connected to a first positive-channel metal oxide semiconductor (PMOS) transistor 214, where the gate of first PMOS 214 may be governed by an output node $OUT_{FBN}$, which in turn may be connected to an OR gate that may take $OUT_P$ and OUT as inputs, as illustrated by circuit logic 216. Further, the inputs $OUT_P$ and $OUT_N$ may be obtained by configuring the cross-coupled PMOS pair 206, 208 to act as inputs for a pair of cross-coupled NOR gates that may include a first NOR gate ($NOR_N$) and a second NOR gate ($NOR_P$), such that $NOR_N$ may take $OUT_{P1}$ and an output of $NOR_P$ ($OUT_P$) as inputs and the second NOR gate ($NOR_N$) may take $OUT_{N1}$ and an output of $NOR_N$ ($OUT_N$) as inputs, as illustrated by circuit logic 218. In some embodiments, $OUT_{FBN}$ may be configured to rise to 1 and to switch off first PMOS transistor 214 after a delay.

In some embodiments, during a precharge phase, the pair of first stage output nodes 210, 212 ($OUT_{P1}$ and $OUT_{N1}$) may be pulled to $V_{DD}$ which may switch off the cross-coupled PMOS pair 206, 208. Since both inputs of the NOR gates $NOR_P$/$NOR_N$ may have at 0'b1 value the output of sampler circuit 200 ($OUT_P$/$OUT_N$) may also be in a zero state. Since both $OUT_N$ and $OUT_P$ may be 0, the $OUT_{FBN}$ node of first PMOS 214 may also be zero thereby keeping first PMOS 214 in a switched-on condition.

In some embodiments, during a sampling phase, the pair of first stage output nodes 210, 212 ($OUT_{P1}$ and $OUT_{N1}$) may be configured to discharge. Further, the rate of discharge may be controlled by input differential pair 220, 222 ($MN_{INP}$/$MN_{INM}$). Once either of $OUT_{P1}$/$OUT_{N1}$ goes down to a sufficiently low level, cross-coupled pair PMOS pair 206, 208 may be triggered and thereby further amplify the difference between $OUT_{P1}$ and $OUT_{N1}$. The output NOR gates $NOR_P$/$NOR_N$ resolve to a value depending on which of $OUT_{P1}$ and $OUT_{N1}$ falls to a lower value. Additionally, when $OUT_P$ or $OUT_N$ rises to 1 first, after some delay the OR gate output $OUT_{FBN}$ may also rise to 1 and thereby switch off first PMOS 214, which may cut off the current path from first PMOS 214, and the pair of first stage output nodes 210, 212 and reduce the overall power consumption of sampler circuit 200.

In some embodiments, a clocking signal (CLK) may be used to provide timing for an N-bit offset code that may be used to counter the effect of the input referred offset automatically generated by sampler circuit 200. When CLK=0, sampler circuit 200 may be in a precharge state, and the first stage outputs $OUT_{P1}$ and $OUT_{N1}$ may be pulled up to $V_{DD}$. When CLK transitions from 0 to 1, first stage output nodes $OUT_{P1}$ and $OUT_{N1}$ may discharge, and whichever node between the two discharges faster may decide the final value of $OUT_P$/$OUT_N$. When an offset code reaches its mid value ($2^{N-1}$), both of the first stage outputs $OUT_{P1}$ and $OUT_{N1}$ may be connected to the same DAC switch load, which may make both sides symmetrical. This may also avoid a potential mismatch issue between $OUT_{P1}$ and $OUT_{N1}$ and may result in a lower deadband zone for sampler circuit 200.

Referring again to FIG. 2, and now to FIGS. 3A-3D, a topology of an offset current DAC circuit 202, a topology of an offset current DAC replica circuit 204, a topology of an offset control logic 224, and a graph 300 of an offset current with respect to an offset code consistent with the embodiment shown in FIG. 2 are provided. An offset current DAC 202 may be used to do offset correction of the sampler. The most significant bit (MSB) of the offset code may be used to control secondary differential pair 226, 228 ($MN_{N1}$ and $MN_{P1}$), which may in turn be used to control the first stage output nodes 210, 212 ($OUT_{P1}$ and $OUT_{N1}$) where the offset current may be steered and thus may control the direction of the offset. The bias for offset current DAC 202 may be a constant current which gives much lesser voltage and temperature drift than other types of biases such as proportional to absolute temperature (PTAT), complementary to absolute temperature (CTAT), or proportional to voltage source (PVDD) current.

In some embodiments, the MSB of an inverted tap offset code may be used to control tertiary differential pair 230, 232 ($MN_{N2}$/$MN_{P2}$), which may, in turn, be used to connect the load of offset current DAC replica 204 to first stage output nodes 210, 212 ($OUT_{P1}$ and $OUT_{N1}$), while offset current DAC replica 204 may be in an OFF state. Offset current DAC replica 204 may have the same switches as offset current DAC 202, but unlike offset current DAC 202 the switches may be in an OFF state. At mid-code, both nodes IDAC_TAIL and IDAC_TAIL1 offer the same capacitive load to $OUT_{P1}$ and $OUT_{N1}$. This makes the sampler symmetric and reduces sampler deadband.

In some embodiments, sampling circuit 200 may use a 5-bit offset code with N=4 as shown in FIG. 3D. For mid codes $[(2^{(N-1)})-1]$ and $2^{(N-1)}$ (15 and 16), DAC<3: 0>=0'b0000. Thus offset current DAC 202 may be switched to an OFF state when the offset code reaches the mid-code value. The tielow voltage of offset current DAC replica 204 may be 0, thus the capacitive load may be fixed to IDAC_TAIL1, and this load may match the capacitance seen at the IDAC_TAIL node for offset current DAC 202 when at mid-code. Thus, the matching loads of offset current DAC 202 and offset current DAC replica 204 may make sampler circuit 200 symmetrical with respect to $OUT_{P1}$ and $OUT_{N1}$ nodes, and this symmetry may reduce the deadband zone.

In some embodiments, offset control logic 224 may include a main NAND gate and a pair of subsidiary NAND gates, where the main NAND gate may take the subsidiary NAND gates as inputs.

In summary, offset current DAC 202 may be steered to one of the pair of first stage output nodes 210, 212 ($OUT_{P1}$ and $OUT_{N1}$) to introduce a new offset in sampler circuit 200. This new offset may be used to cancel out the effect of the input referred offset generated by sampler circuit 200. The MSB of the offset code may be used to control secondary differential pair 226, 228 ($MN_{N1}$ and $MN_{P1}$) and may also decide which node out of first stage output nodes 210, 212 ($OUT_{P1}$ and $OUT_{N1}$) may receive the offset current. Thus, the MSB of the offset code may be used to decide the polarity of the sampler offset, while the lower bits of the offset code may be used to control offset current DAC 202.

Figure 4:
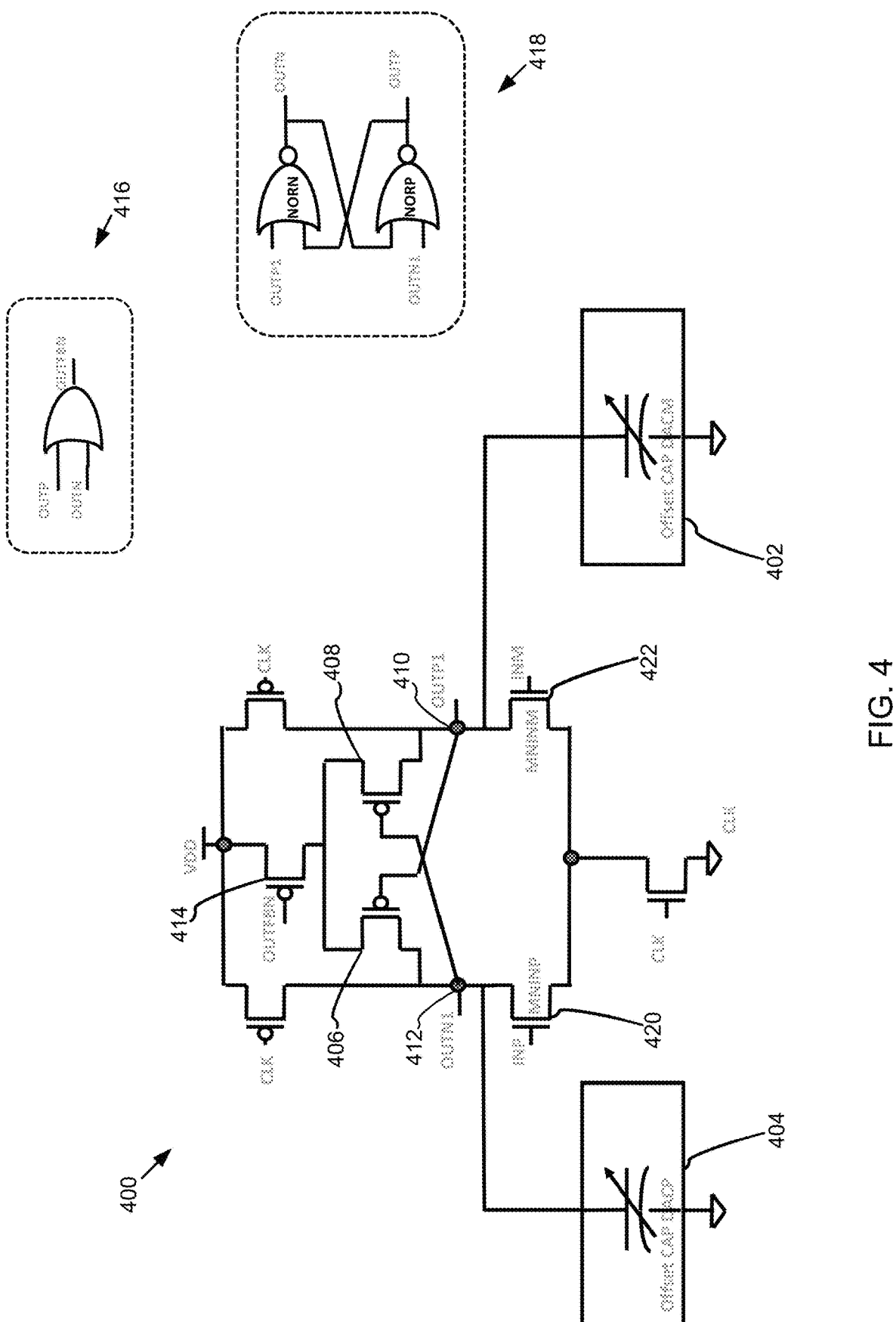
FIG. 4 shows a topology of a sampler circuit using a first offset capacitive DAC and a second offset capacitive DAC consistent with embodiments of the present disclosure.

Referring now to FIG. 4, a topology of a sampler circuit 400 using a first offset capacitive DAC (CAPDAC) 402 and a second offset CAPDAC 404 consistent with embodiments of the present disclosure is provided. A pair of cross-coupled PMOS transistors 406, 408 may drain to a pair of first stage output nodes 410, 412 ($OUT_{P1}$ and $OUT_{N1}$) of sampler circuit 400. A voltage source ($V_{DD}$) of cross-coupled PMOS transistors 406, 408 may be connected to a first positive-channel metal oxide semiconductor (PMOS) transistor 414, where the gate of first PMOS 414 may be governed by an output node $OUT_{FBN}$, which in turn may be connected to an OR gate that may take $OUT_P$ and $OUT_N$ as inputs, as illustrated by circuit logic 416. Further, the inputs $OUT_P$ and $OUT_N$ may be obtained by configuring the cross-coupled PMOS pair 406, 408 to act as inputs for a pair of cross-coupled NOR gates that may include a first NOR gate ($NOR_N$) and a second NOR gate ($NOR_P$), such that $NOR_N$ may take $OUT_{P1}$ and an output of $NOR_P$ ($OUT_P$) as inputs and the second NOR gate ($NOR_P$) may take $OUT_{N1}$ and an output of $NOR_N$ ($OUT_N$) as inputs, as illustrated by circuit logic 418. In some embodiments, $OUT_{FBN}$ may be configured to rise to 1 and switch off first PMOS transistor 414 after a delay.

In some embodiments, during a precharge phase, the pair of first stage output nodes 410, 412 ($OUT_{P1}$ and $OUT_{N1}$) may be pulled to $V_{DD}$ which may switch off the cross-coupled PMOS pair 406, 408. Since both inputs of the NOR gates $NOR_P$/$NOR_N$ may have at 0'b1 value, the output of sampler circuit 400 ($OUT_P$/$OUT_N$) may also be in a zero state. Since both $OUT_N$ and $OUT_P$ may be 0, the $OUT_{FBN}$ node of first PMOS 414 may also be zero thereby keeping first PMOS 414 in switched-on condition.

In some embodiments, during a sampling phase, the pair of first stage output nodes 410, 412 ($OUT_{P1}$ and $OUT_{N1}$) may be configured to discharge. Further, the rate of discharge may be controlled by the input diff pair 420, 422 ($MN_{INP}$/$MN_{INM}$). Once either of $OUT_{P1}$/$OUT_{N1}$ goes down to a sufficiently low level, cross-coupled pair PMOS pair

406, 408 may be triggered and thereby further amplify the difference between $OUT_{P1}$ and $OUT_{N1}$. The output NOR gates $NOR_P$/$NOR_N$ resolve to a value depending on which of $OUT_{P1}$ and $OUT_{N1}$ falls to a lower value. Additionally, when $OUT_P$ or $OUT_N$ rises to 1 first, after some delay the OR gate output $OUT_{FBN}$ may also rise to 1 and thereby switch off first PMOS 414, which may cut off the current path from first PMOS 414, and the pair of first stage output nodes 410, 412 and reduce the overall power consumption of sampler circuit 400.

In some embodiments, a clocking signal (CLK) may be used to provide timing for an N-bit offset code that may be used to counter the effect of the input referred offset automatically generated by sampler circuit 400. When CLK=0, sampler circuit 400 may be in a precharge state, and the first stage outputs $OUT_{P1}$ and $OUT_{N1}$ may be pulled up to $V_{DD}$. When CLK transitions from 0 to 1, first stage output nodes $OUT_{P1}$ and $OUT_{N1}$ may discharge, and whichever node between the two discharges faster may decide the final value of $OUT_P$/$OUT_N$. When an offset code reaches its mid value $(2^{N-1})$, both of the first stage outputs $OUT_{P1}$ and $OUT_{N1}$ may be connected to the same DAC capacitive load, which may make both sides symmetrical. This may also avoid a potential mismatch issue between $OUT_{P1}$ and $OUT_{N1}$ and may result in a lower deadband zone for sampler circuit 400.

Figures 5A, 5B, 5C, 5D:
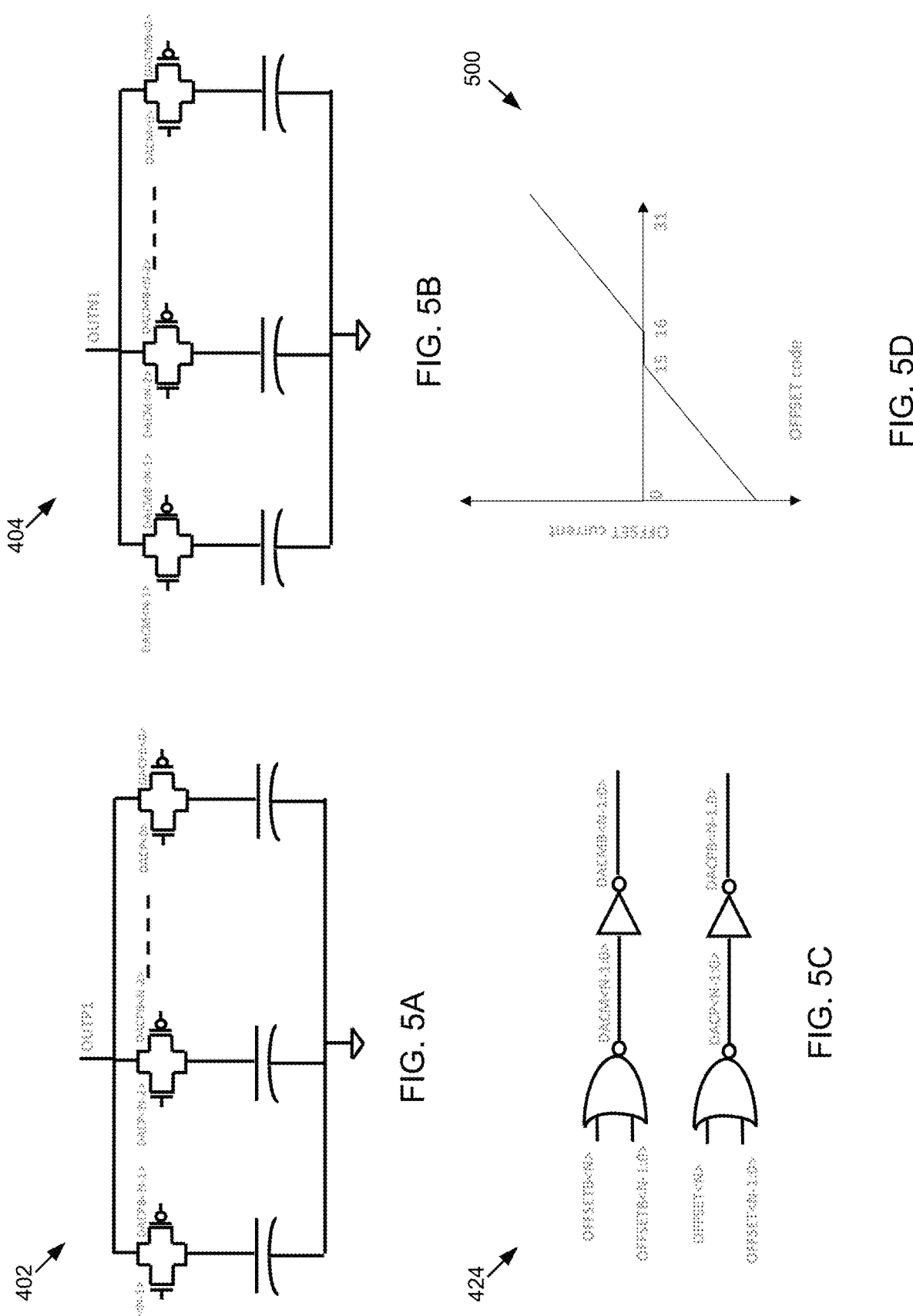
FIG. 5A shows a topology of the first offset capacitive DAC circuit consistent with the embodiment shown in FIG. 4.
FIG. 5B shows a topology of the second offset capacitive DAC circuit consistent with the embodiment shown in FIG. 4.
FIG. 5C shows a topology of an offset control logic consistent with the embodiment shown in FIG. 4.
FIG. 5D shows a graph of an offset current with respect to an offset code consistent with the embodiment shown in FIG. 4.

Referring again to FIG. 4, and now to FIGS. 5A-5D, a topology of the first offset CAPDAC circuit 402, the second offset CAPDAC circuit 404, a topology of an offset control logic 424, and a graph 500 of an offset current with respect to an offset code consistent with the embodiment shown in FIG. 4 are provided. In some embodiments, sampling circuit 400 may use a 5-bit offset code with N=4 as shown in FIG. 5D. For mid codes $[(2^{(N-1)})-1]$ and $2^{(N-1)}$ (15 and 16), DAC<3:0>=0'b0000 there may be zero capacitive load placed on the pair of first stage output nodes 410, 412 ($OUT_{P1}$ and $OUT_{N1}$). As such, both the first and the second offset CAPDACs 402, 404 may be in an OFF state when receiving mid-codes $[(2^{(N-1)})-1]$ and $2^{(N-1)}$ (15 and 16). When receiving codes $[(2^{(N-1)})-1]$ to 0 (15-0) of the N-bit offset code, the capacitance of output node 410 ($OUT_{P1}$) may be increased and the capacitance of output node 412 ($OUT_{N1}$) may be in an OFF state. Further, when receiving codes $2^{(N-1)}$ to $[(2)-1]$ (16-31) of the N-bit offset code, the capacitance of $OUT_{N1}$ may be increased and the capacitance of $OUT_{P1}$ may be in an OFF state.

For offset codes, 15 to 0, the time taken for $OUT_{P1}$ to discharge may be slower than the time taken for $OUT_{N1}$ to discharge. This difference in discharge time may translate to an input referred offset on sampler circuit 400 which, may be programmed to cancel the offset generated by sampler circuit 400. Similarly, for offset codes 16 to 31, the time taken for $OUT_{N1}$ to discharge may be slower than the time taken for $OUT_{P1}$ to discharge. This difference in discharge time may translate to an input referred offset on sampler circuit 400, which may be programmed to cancel the offset generated by sampler circuit 400. Effectively, the discharge time at first stage output nodes 410, 412 ($OUT_{P1}$ and $OUT_{N1}$) may be controlled by the amount of capacitance in the first and the second offset CAPDACs 402, 404.

In some embodiments, offset control logic 424 may include a pair of NOR gates, the output of which may each be fed to an inverter as an input.

Figure 6:
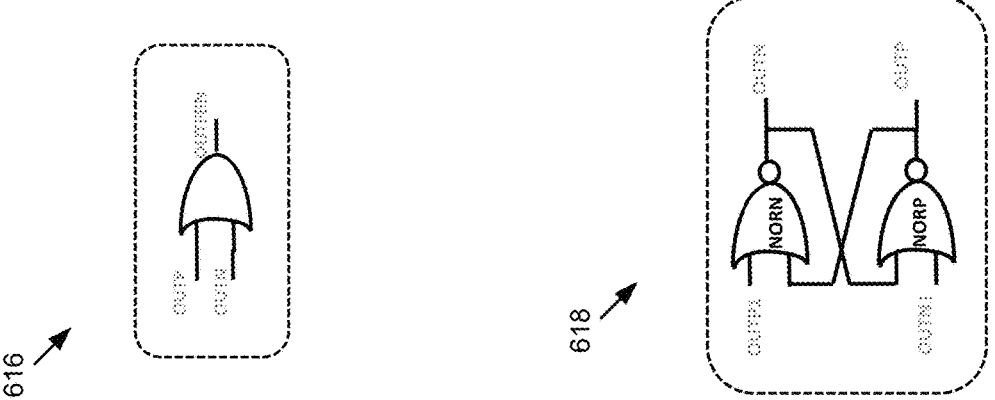
FIG. 6 shows a topology of a sampler circuit using a first offset current DAC and a second offset current DAC consistent with embodiments of the present disclosure.
Figure 6:
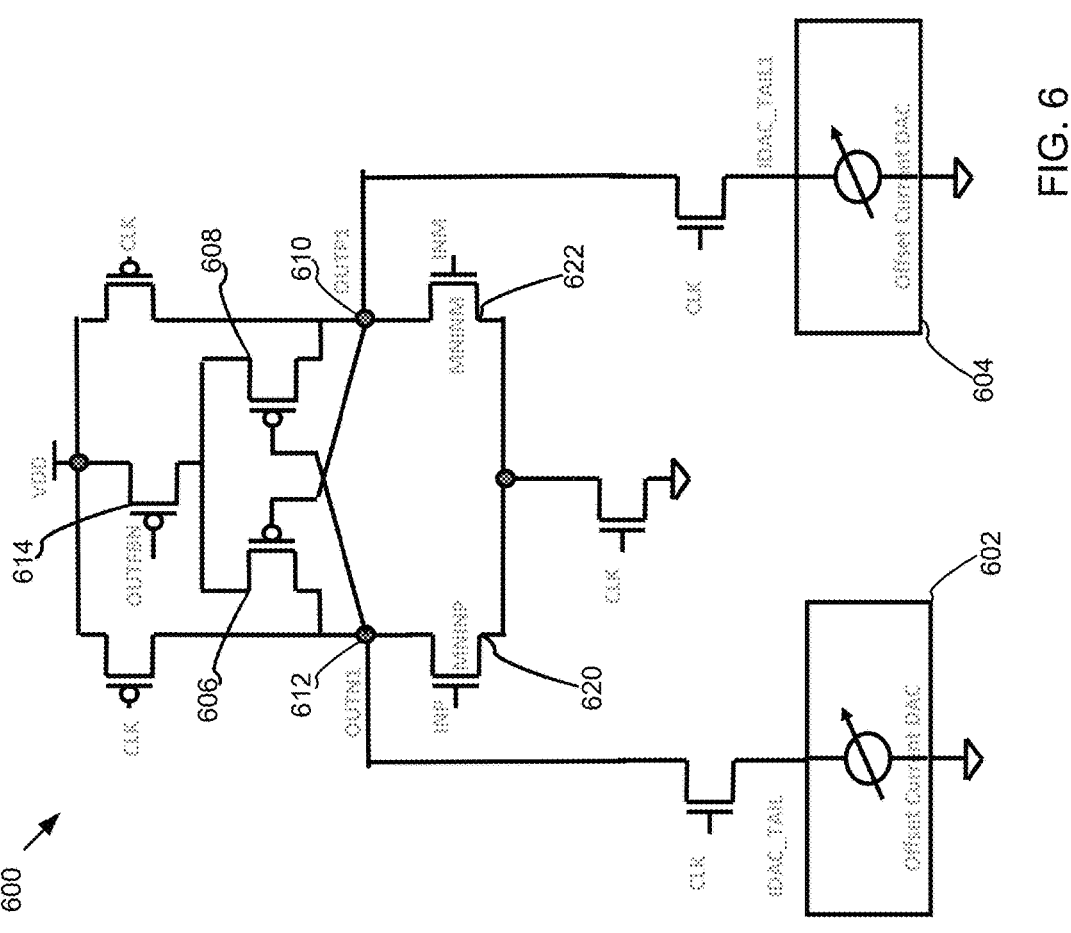

Referring now to FIG. 6, a topology of a sampler circuit 600 using a first offset current DAC 602 and a second offset current DAC 604 consistent with embodiments of the present disclosure is provided. A pair of cross-coupled PMOS transistors 606, 608 may drain to a pair of first stage output nodes 610, 612 (OUT$_{P1}$ and OUT$_{N1}$) of sampler circuit 600. A voltage source (V$_{DD}$) of cross-coupled PMOS transistors 606, 608 may be connected to a first positive-channel metal oxide semiconductor (PMOS) transistor 614, where the gate of first PMOS 614 may be governed by an output node OUT$_{FBN}$, which in turn may be connected to an OR gate that may take OUT$_P$ and OUT$_N$ as inputs, as illustrated by circuit logic 616. Further, the inputs OUT$_P$ and OUT$_N$ may be obtained by configuring the cross-coupled PMOS pair 606, 608 to act as inputs for a pair of cross-coupled NOR gates that may include a first NOR gate (NOR$_N$) and a second NOR gate (NOR$_P$), such that NOR$_N$ may take OUT$_{P1}$ and an output of NOR$_P$ (OUT$_P$) as inputs and the second NOR gate (NOR$_P$) may take OUT$_{N1}$ and an output of NOR$_N$ (OUT$_N$) as inputs, as illustrated by circuit logic 618. In some embodiments, OUT$_{FBN}$ may be configured to rise to 1 and switch off first PMOS transistor 614 after a delay.

In some embodiments, during a precharge phase, the pair of first stage output nodes 610, 612 (OUT$_{P1}$ and OUT$_{N1}$) may be pulled to V$_{DD}$ which may switch off the cross-coupled PMOS pair 606, 608. Since both inputs of the NOR gates NOR$_P$/NOR$_N$ may have at 0'b1000 value, the output of sampler circuit 600 (OUT$_P$/OUT$_N$) may also be in a zero state. Since both OUT$_N$ and OUT$_P$ may be 0, the OUT$_{FBN}$ node of first PMOS 614 may also be zero thereby keeping first PMOS 614 in switched-on condition.

In some embodiments, during a sampling phase, the pair of first stage output nodes 610, 612 (OUT$_{P1}$ and OUT$_{N1}$) may be configured to discharge. Further, the rate of discharge may be controlled by the input diff pair 620, 622 (MN$_{INP}$/MN$_{INM}$). Once either of OUT$_{P1}$/OUT$_{N1}$ goes down to a sufficiently low level, cross-coupled pair PMOS pair 606, 608 may be triggered and thereby further amplify the difference between OUT$_{P1}$ and OUT$_{N1}$. The output NOR gates NOR$_P$/NOR$_N$ resolve to a value depending on which of OUT$_{P1}$ and OUT$_{N1}$ falls to a lower value. Additionally, when OUT$_P$ or OUT$_N$ rises to 1 first, after some delay the OR gate output OUT$_{FBN}$ may also rise to 1 and thereby switch off first PMOS 614, which may cut off the current path from first PMOS 614, and the pair of first stage output nodes 610, 612 and reduce the overall power consumption of sampler circuit 600.

In some embodiments, a clocking signal (CLK) may be used to provide timing for an N-bit offset code that may be used to counter the effect of the input referred offset automatically generated by sampler circuit 600. When CLK=0, sampler circuit 600 may be in a precharge state, and the first stage outputs OUT$_{P1}$ and OUT$_{N1}$ may be pulled up to V$_{DD}$. When CLK transitions from 0 to 1, first stage output nodes OUT$_{P1}$ and OUT$_{N1}$ may discharge, and whichever node between the two discharges faster may decide the final value of OUT$_P$/OUT$_N$. When an offset code reaches its mid value ($2^{N-1}$), both of the first stage outputs OUT$_{P1}$ and OUT$_{N1}$ may be connected to the same DAC current load, which may make both sides symmetrical. This may also avoid a potential mismatch issue between OUT$_{P1}$ and OUT$_{N1}$ and may result in a lower deadband zone for sampler circuit 600.

Figure 7A:
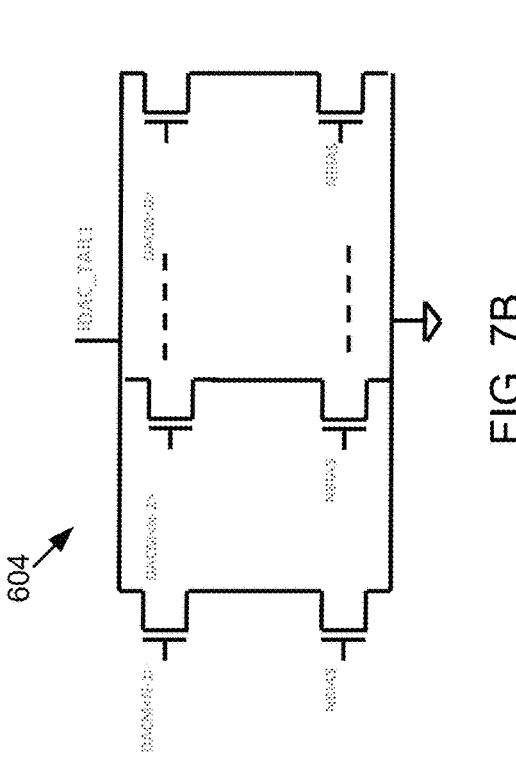
FIG. 7A shows a topology of a first offset current DAC circuit consistent with the embodiment shown in FIG. 6.
Figure 7B:
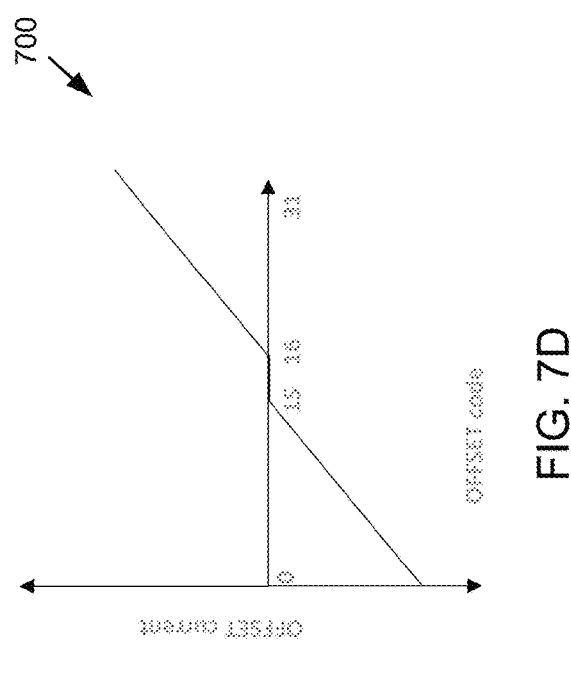
FIG. 7B shows a topology of a second offset current DAC circuit consistent with the embodiment shown in FIG. 6.
Figure 7C:
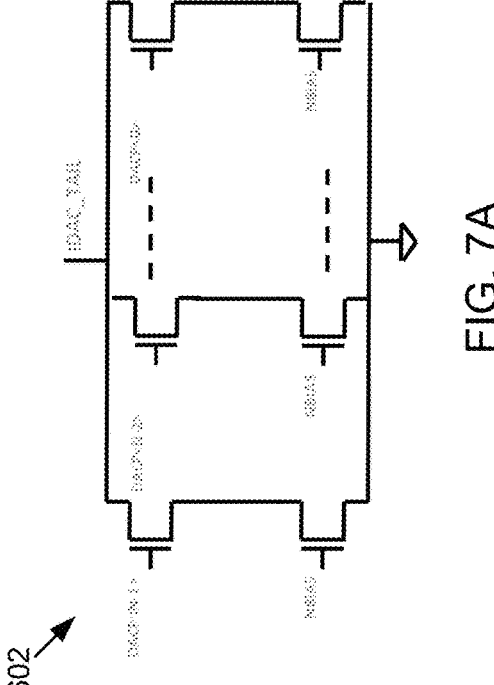
FIG. 7C shows a topology of an offset control logic consistent with the embodiment shown in FIG. 6.
Figure 7D:
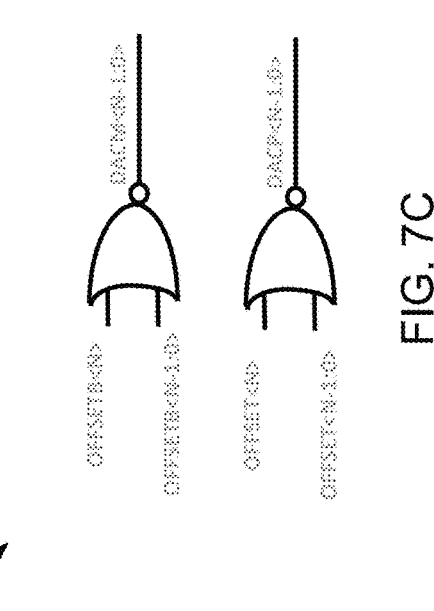
FIG. 7D shows a graph of an offset current with respect to an offset code consistent with the embodiment shown in FIG. 6.

Referring again to FIG. 6, and now to FIGS. 7A-7D, a topology of a first offset current DAC circuit 602, a topology of a second offset current DAC circuit 604, a topology of an offset control logic 624, and a graph 700 of an offset current with respect to an offset code consistent with the embodiment shown in FIG. 6 are provided. In some embodiments, sampling circuit 400 may use a 5-bit offset code with N=4 as shown in FIG. 7D. For mid codes [($2^{(N-1)}$)−1] and $2^{(N-1)}$ (15 and 16), DACP<3:0>=0 and DACM<3:0>=0 the switches included in both offset current DACs 602, 604 may be configured to be in an OFF state. As such, when receiving mid-codes [($2^{(N-1)}$)−1] and $2^{(N-1)}$ (15 and 16), both offset current DACs 602, 604 may be in an OFF state and the pair of first stage output nodes 610, 612 (OUT$_{P1}$ and OUT$_{N1}$) may not receive any current.

When receiving codes [($2^{(N-1)}$)−1] to 0 (15-0) of the N-bit offset code, second offset current DAC 604 operatively connected to first stage output node 610 (OUT$_{P1}$) may be in an OFF state, while first offset current DAC 602 operatively connected to first stage output node 612 (OUT$_{N1}$) may be in an ON state. This may cause the time taken for OUT$_{P1}$ to discharge to be slower than the time taken for OUT$_{N1}$ to discharge. Further, when receiving codes $2^{(N-1)}$ to [(22)−1] (16-31) of the N-bit offset code, first offset current DAC 602 operatively connected to OUT$_{N1}$ may be in an OFF state, while second offset current DAC 604 operatively connected to OUT$_{P1}$ may be in an ON state. This may cause the time taken for OUT$_{N1}$ to discharge to be slower than the time taken for OUT$_{P1}$ to discharge. This difference in discharge times may translate to an input referred offset on sampler circuit 600, which may be programmed to cancel the offset generated by sampler circuit 600. Effectively, the structural symmetry of first offset current DAC 602 and second offset current DAC 604, may cause the deadband introduced due to sampler circuit 600 to be functionally negligible.

In some embodiments, offset control logic 624 may include a pair of NOR gates, the output of which may each be fed to an inverter as an input.

Figure 8:
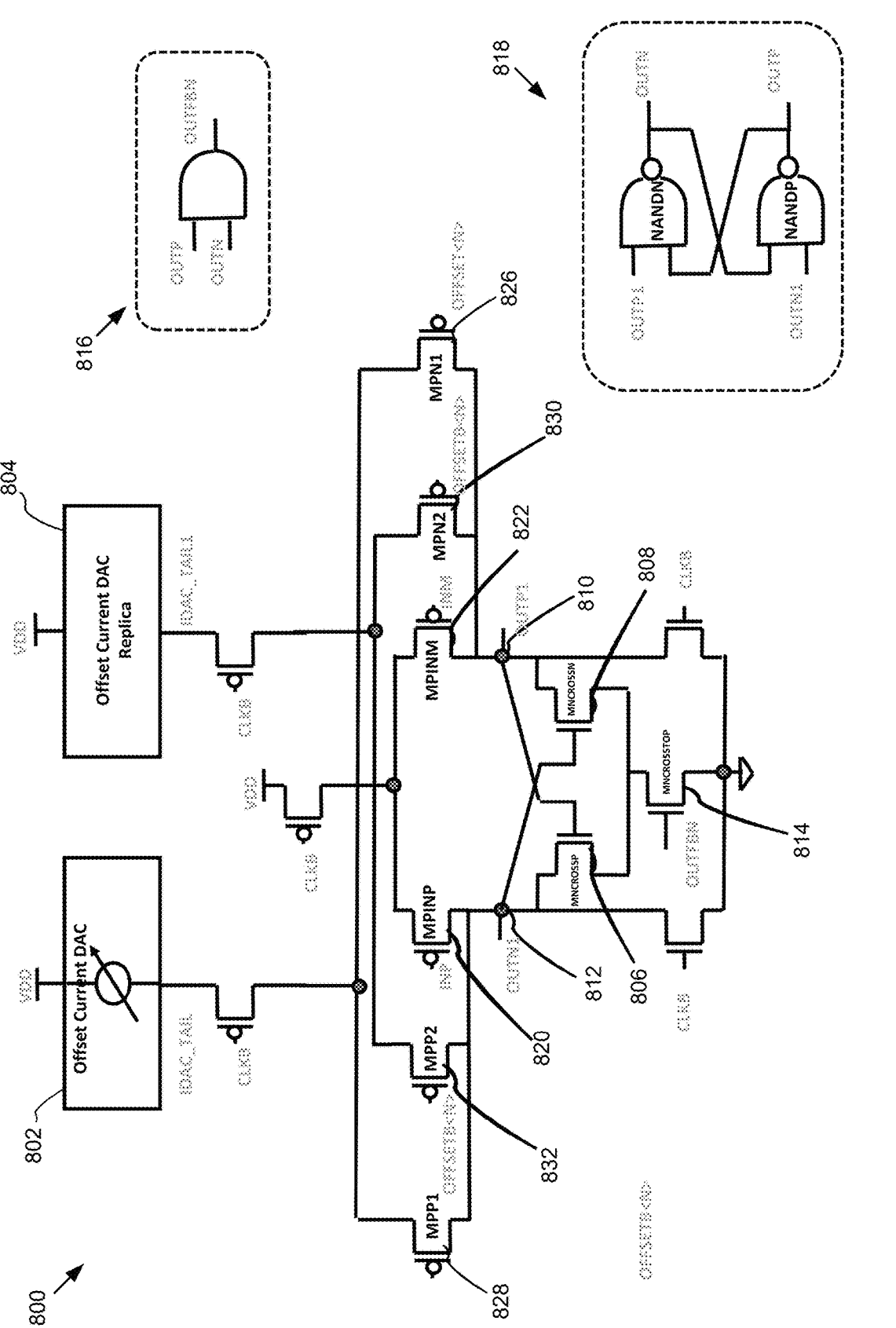
FIG. 8 shows a topology of an inverted sampler circuit using an offset current DAC and an offset current DAC replica consistent with embodiments of the present disclosure.

Referring now to FIG. 8, a topology of an inverted sampler circuit 800 using an offset current DAC 802 and an offset current DAC replica 804 consistent with embodiments of the present disclosure is provided. A pair of cross-coupled NMOS transistors 806, 808 may drain to a pair of first stage output nodes 810, 812 (OUT$_{P1}$ and OUT$_{N1}$) of inverted sampler circuit 800. The gate of a first negative-channel metal oxide semiconductor (NMOS) transistor 814 may be governed by an output node OUT$_{FBN}$, which in turn may be connected to an AND gate that may take OUT$_P$ and OUT$_N$ as inputs, as illustrated by circuit logic 816. Further, the inputs OUT$_P$ and OUT$_N$ may be obtained by configuring the cross-coupled NMOS pair 806, 808 to act as inputs for a pair of cross-coupled NAND gates that may include a first NAND gate (NAND$_N$) and a second NAND gate (NAND$_P$), such that NAND$_N$ may take OUT$_{P1}$ and an output of NAND$_P$ (OUT$_P$) as inputs and the second NAND gate (NAND$_P$) may take OUT$_{N1}$ and an output of NAND (OUT$_N$) as inputs, as illustrated by circuit logic 818. In some embodiments, OUT$_{FBN}$ may be configured to fall to 0 and to switch off first NMOS transistor 814 after a delay.

Additionally, a voltage source (V$_{DD}$) may be connected to offset current DAC 802 and an offset current DAC replica 804, while the first NMOS transistor may be connected to ground. This configuration is the inversion of sampler circuit 200 shown in FIG. 2, where first PMOS transistor 214 may be connected to a voltage source while offset current DAC 202 and offset current DAC replica 204 may be connected to ground. This difference may be best observed in a comparison of FIGS. 3A-B to FIGS. 9A-B, which may show offset current DAC 202 and offset current DAC replica 204 connected to ground and using a "tielow" voltage, while offset current DAC 802 and an offset current DAC replica 804 may be shown connected to voltage source (V$_{DD}$) and using a "tiehigh" voltage.

Referring again to FIG. 8, and now to FIGS. 9A-9D, a topology of an offset current DAC circuit 802, a topology of an offset current DAC replica circuit 804, a topology of an offset control logic 824, and a graph 900 of an offset current with respect to an offset code consistent with the embodiment shown in FIG. 8 are provided. An offset current DAC 802 may be used to do offset correction of the sampler. The most significant bit (MSB) of the offset code may be used to control secondary differential pair 826, 828 ($MN_{N1}$ and $MN_{P1}$), which may in turn be used to control the first stage output nodes 810, 812 ($OUT_{P1}$ and $OUT_{N1}$) where the offset current may be steered and thus may control the direction of the offset. The bias for offset current DAC 802 may be a constant current which gives much lesser voltage and temperature drift than other types of biases such as proportional to absolute temperature (PTAT), complementary to absolute temperature (CTAT), or proportional to voltage source (PVDD) current.

In some embodiments, the MSB of an inverted tap offset code may be used to control tertiary differential pair 830, 832 ($MN_{N2}/MN_{P2}$), which may, in turn, be used to connect the load of offset current DAC replica 804 to first stage output nodes 810, 812 ($OUT_{P1}$ and $OUT_{N1}$), while offset current DAC replica 804 may be in an OFF state. Offset current DAC replica 804 may have the same switches as offset current DAC 802, but unlike offset current DAC 202 the switches may be in an OFF state. At mid-code, both nodes IDAC_TAIL and IDAC_TAIL1 offer the same capacitive load to $OUT_{P1}$ and $OUT_{N1}$. This makes the sampler symmetric and reduces sampler deadband.

In some embodiments, sampling circuit 800 may use a 5-bit offset code with N=4 as shown in FIG. 9D. For mid codes [($2^{(N-1)}$)–1] and $2^{(N-1)}$ (15 and 16), DAC<3:0>=0'b0000. The tiehigh voltage of offset current DAC replica 804 may be equal to the voltage source ($V_{DD}$), thus offset current DAC 802 may be switched to an OFF state when the offset code reaches the mid-code value. Further, because the tiehigh voltage of offset current DAC replica may be fixed to the value of the voltage source ($V_{DD}$), the capacitive load may be fixed to IDAC_TAIL1, and this load may match the capacitance seen at the IDAC_TAIL node for offset current DAC 802 when at mid-code. Thus, the matching loads of offset current DAC 802 and offset current DAC replica 804 may make sampler circuit 800 symmetrical with respect to $OUT_{P1}$ and $OUT_{N1}$ nodes, and this symmetry may reduce the deadband zone.

In some embodiments, offset control logic 824 may include a main NAND gate and a pair of subsidiary NAND gates, where the main NAND gate may take the subsidiary NAND gates as inputs.

In some embodiments, a clocking signal (CLK) may be inverted (CLKB), and the inverted signal may be used to provide timing for an N-bit offset code that may be used to counter the effect of the input referred offset automatically generated by sampler circuit 800. When CLK=0 or CLKB=1, sampler circuit 800 may be in a precharge state, and the first stage outputs $OUT_{P1}$ and $OUT_{N1}$ may be pulled down to ground. When CLK transitions from 0 to 1 or CLKB transitions from 1 to 0, first stage output nodes $OUT_{P1}$ and $OUT_{N1}$ may discharge, and whichever node between the two discharges faster may decide the final value of $OUT_P/OUT_N$. When an offset code reaches its mid value ($2^{N-1}$), both of the first stage outputs $OUT_{P1}$ and $OUT_{N1}$ may be connected to the same DAC capacitive load, which may make both sides symmetrical. This may also avoid a potential mismatch issue between $OUT_{P1}$ and $OUT_{N1}$ and may result in a lower deadband zone for sampler circuit 800.

Figure 10:
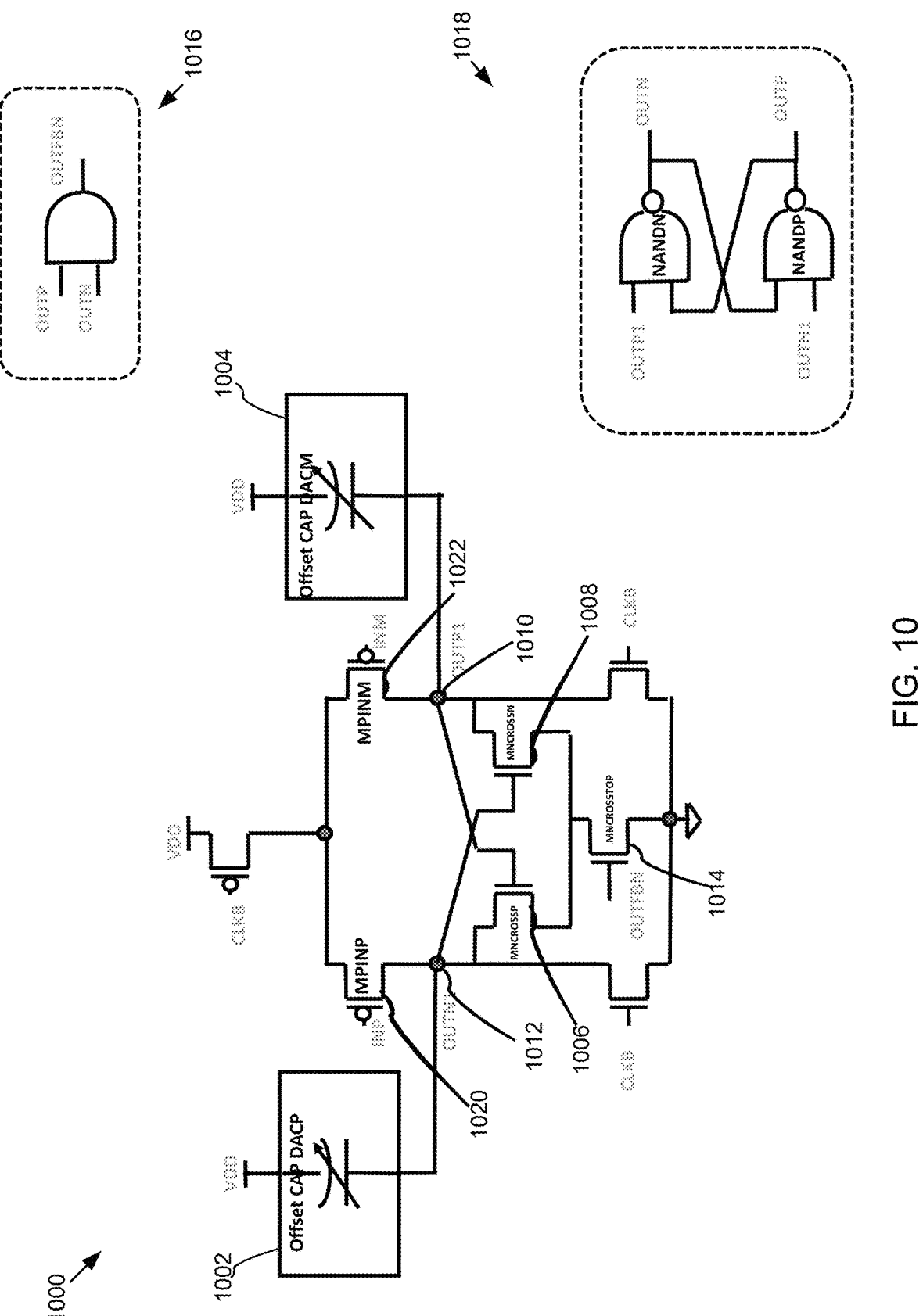
FIG. 10 shows a topology of an inverted sampler circuit using a first offset capacitive DAC and a second offset capacitive DAC consistent with embodiments of the present disclosure.
Figure 11:
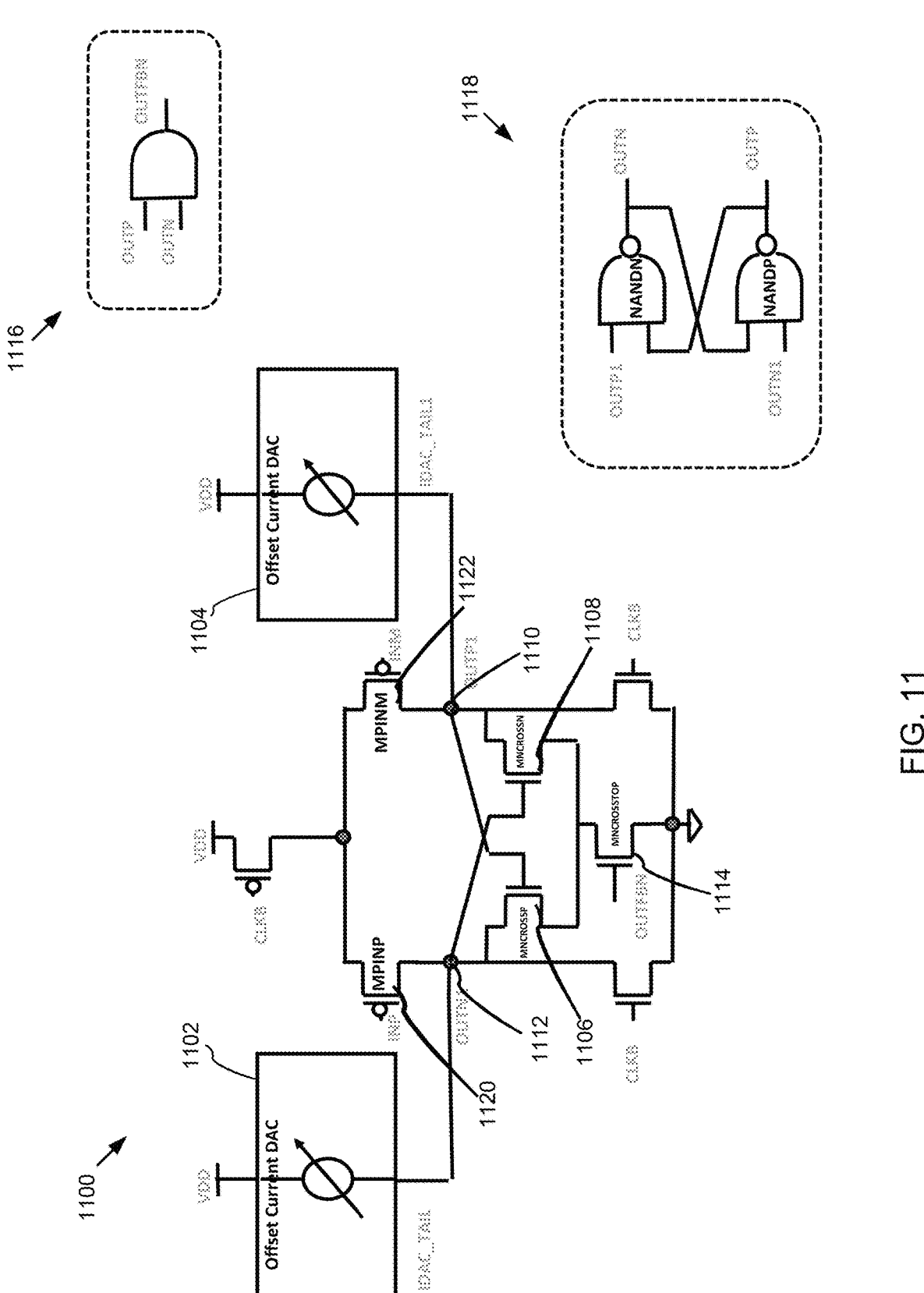
FIG. 11 shows a topology of an inverted sampler circuit using a first offset current DAC and a second offset current DAC consistent with embodiments of the present disclosure.

Referring now to FIGS. 10 and 11, a topology of an inverted sampler circuit 1000 using a first offset capacitive DAC (CAPDAC) 1002 and a second offset CAPDAC 1004, and a topology of an inverted sampler circuit 1100 using a first offset current DAC 1102 and a second offset current DAC 1104 consistent with embodiments of the present disclosure are provided. In the much same way that the previously discussed inverted sampler circuit 800 shown in FIG. 8 may be considered an inverse of sampler circuit 200 shown in FIG. 2, inverted sampler circuits 1000 and 1100 may also be considered inverses of the sampler circuits 400 and 600, shown in FIGS. 6 and 8 respectively.

Referring again to FIG. 10, a topology of a sampler circuit 1000 using a first offset capacitive DAC (CAPDAC) 1002 and a second offset CAPDAC 1004 consistent with embodiments of the present disclosure is provided. A pair of cross-coupled NMOS transistors 1006, 1008 may drain to a pair of first stage output nodes 1010, 1012 ($OUT_{P1}$ and $OUT_{N1}$) of sampler circuit 1000. A voltage source ($V_{DD}$)) of cross-coupled NMOS transistors 1006, 1008 may be connected to a first negative-channel metal oxide semiconductor (NMOS) transistor 1014, where the gate of first NMOS 1014 may be governed by an output node $OUT_{FBN}$, which in turn may be connected to an AND gate that may take $OUT_P$ and $OUT_N$ as inputs, as illustrated by circuit logic 1016. Further, the inputs $OUT_P$ and $OUT_N$ may be obtained by configuring the cross-coupled NMOS pair 1006, 1008 to act as inputs for a pair of cross-coupled NAND gates that may include a first NAND gate ($NAND_N$) and a second NAND gate ($NAND_P$), such that $NAND_N$ may take $OUT_{P1}$ and an output of $NAND_P$ ($OUT_P$) as inputs and the second NAND gate ($NAND_P$) may take $OUT_{N1}$ and an output of $NAND_N$ ($OUT_N$) as inputs, as illustrated by circuit logic 1018. In some embodiments, $OUT_{FBN}$ may be configured to fall to 0 and switch off first NMOS transistor 1014 after a delay.

In some embodiments, during a precharge phase, the pair of first stage output nodes 1010, 1012 ($OUT_{P1}$ and $OUT_{N1}$) may be pulled to ground which may switch off the cross-coupled NMOS pair 1006, 1008. Since both inputs of the NAND gates $NAND_P/NAND_N$ may have at 0'b0 value, the output of sampler circuit 1000 ($OUT_P/OUT_N$) may also be in a one state. Since both $OUT_N$ and $OUT_P$ may be 1, the $OUT_{FBN}$ node of first NMOS 1014 may also be one thereby keeping first NMOS 1014 in switched-on condition.

In some embodiments, during a sampling phase, the pair of first stage output nodes 1010, 1012 ($OUT_{P1}$ and $OUT_{N1}$) may be configured to discharge. Further, the rate of discharge may be controlled by the input diff pair 1020, 1022 ($MN_{INP}/MN_{INM}$). Once either of $OUT_{P1}/OUT_{N1}$ goes up to a sufficiently high level, cross-coupled pair NMOS pair 1006, 1008 may be triggered and thereby further amplify the difference between $OUT_{P1}$ and $OUT_{N1}$. The output NAND gates $NAND_P/NAND_N$ resolve to a value depending on which of $OUT_{P1}$ and $OUT_{N1}$ rises to a higher value. Additionally, when $OUT_P$ or $OUT_N$ falls to 0 first, after some delay the AND gate output $OUT_{FBN}$ may also fall to 0 and thereby switch off first NMOS 1014, which may cut off the current path from first NMOS 1014, and the pair of first stage output nodes 1010, 1012 and reduce the overall power consumption of sampler circuit 1000.

In some embodiments, a clocking signal (CLK) may be used to provide timing for an N-bit offset code that may be used to counter the effect of the input referred offset automatically generated by sampler circuit 1000. When CLK=0 or CLKB=1, sampler circuit 1000 may be in a precharge state, and the first stage outputs $OUT_{P1}$ and $OUT_{N1}$ may be pulled down to ground. When CLK transitions from 0 to 1 or when CLKB transitions from 1 to 0, first stage output nodes $OUT_{P1}$ and $OUT_{N1}$ may discharge, and whichever node between the two discharges faster may decide the final value of $OUT_P/OUT_N$. When an offset code reaches its mid value ($2^{N-1}$), both of the first stage outputs $OUT_{P1}$ and $OUT_{N1}$ may be connected to the same DAC capacitive load, which may make both sides symmetrical. This may also avoid a potential mismatch issue between $OUT_{P1}$ and $OUT_{N1}$ and may result in a lower deadband zone for sampler circuit 1000.

In some embodiments, sampling circuit 1000 may use a 5-bit offset code with N=4. For mid codes [($2^{(N-1)}$)−1] and $2^{(N-1)}$ (15 and 16), DAC<3:0>=0'b0000 there may be zero capacitive load placed on the pair of first stage output nodes 1010, 1012 ($OUT_{P1}$ and $OUT_{N1}$). As such, both the first and the second offset CAPDACs 1002, 1004 may be in an OFF state when receiving mid-codes [($2^{(N-1)}$−1] and $2^{(N-1)}$ (15 and 16). When receiving codes [($2^{(N-1)}$)−1] to 0 (15-0) of the N-bit offset code, the capacitance of output node 1010 ($OUT_{P1}$) may be in an OFF state and the capacitance of output node 1012 ($OUT_{N1}$) may be increased. Further, when receiving codes $2^{(N-1)}$ to [($2^{N}$)−1] (16-31) of the N-bit offset code, the capacitance of $OUT_{P1}$ may be increased and the capacitance of $OUT_{N1}$ may be in an OFF state.

For offset codes, 15 to 0, the time taken for $OUT_{N1}$ to discharge may be slower than the time taken for $OUT_{P1}$ to discharge. This difference in discharge time may translate to an input referred offset on sampler circuit 1000 which, may be programmed to cancel the offset generated by sampler circuit 1000. Similarly, for offset codes 16 to 31, the time taken for $OUT_{P1}$ to discharge may be slower than the time taken for $OUT_{N1}$ to discharge. This difference in discharge time may translate to an input referred offset on sampler circuit 1000, which may be programmed to cancel the offset generated by sampler circuit 1000. Effectively, the discharge time at first stage output nodes 1010, 1012 ($OUT_{P1}$ and $OUT_{N1}$) may be controlled by the amount of capacitance in the first and the second offset CAPDACs 1002, 1004.

In some embodiments, an offset control logic may include a pair of NOR gates, the output of which may each be fed to an inverter as an input.

Referring now to FIG. 11, a topology of a sampler circuit 1100 using a first offset current DAC 1102 and a second offset current DAC 1104 consistent with embodiments of the present disclosure is provided. A pair of cross-coupled NMOS transistors 1106, 1108 may drain to a pair of first stage output nodes 1110, 1112 ($OUT_{P1}$ and $OUT_{N1}$) of sampler circuit 1100. A voltage source ($V_{DD}$) of cross-coupled NMOS transistors 1106, 1108 may be connected to a first negative-channel metal oxide semiconductor (NMOS) transistor 1114, where the gate of first NMOS 1114 may be governed by an output node $OUT_{FBN}$, which in turn may be connected to an AND gate that may take $OUT_P$ and $OUT_N$ as inputs, as illustrated by circuit logic 1116. Further, the inputs $OUT_P$ and $OUT_N$ may be obtained by configuring the cross-coupled NMOS pair 1106, 1108 to act as inputs for a pair of cross-coupled NAND gates that may include a first NAND gate ($NAND_N$) and a second NAND gate ($NAND_P$), such that $NAND_N$ may take $OUT_{P1}$ and an output of $NAND_P$ ($OUT_P$) as inputs and the second NAND gate ($NAND_P$) may take $OUT_{N1}$ and an output of $NAND_N$ ($OUT_N$) as inputs, as illustrated by circuit logic 1118. In some embodiments, $OUT_{FBN}$ may be configured to fall to 0 and switch off first NMOS transistor 1114 after a delay.

In some embodiments, during a precharge phase, the pair of first stage output nodes 1110, 1112 ($OUT_{P1}$ and $OUT_{N1}$) may be pulled to ground which may switch off the cross-coupled NMOS pair 1106, 1108. Since both inputs of the NAND gates $NAND_P$/$NAND_N$ may have at 0'b0 value, the output of sampler circuit 1100 ($OUT_P$/$OUT_N$) may also be in a one state. Since both $OUT_N$ and $OUT_P$ may be 1, the $OUT_{FBN}$ node of first NMOS 1114 may also be one thereby keeping first NMOS 1114 in switched-on condition.

In some embodiments, during a sampling phase, the pair of first stage output nodes 1110, 1112 ($OUT_{P1}$ and $OUT_{N1}$) may be configured to discharge. Further, the rate of discharge may be controlled by the input diff pair 1120, 1122 ($MN_{INP}$/$MN_{INM}$). Once either of $OUT_{P1}$/$OUT_{N1}$ goes up to a sufficiently high level, cross-coupled pair NMOS pair 1106, 1108 may be triggered and thereby further amplify the difference between $OUT_{P1}$ and $OUT_{N1}$. The output NAND gates $NAND_P$/$NAND_N$ resolve to a value depending on which of $OUT_{P1}$ and $OUT_{N1}$ rises to a higher value. Additionally, when $OUT_P$ or $OUT_N$ falls to 0 first, after some delay the AND gate output $OUT_{FBN}$ may also fall to 0 and thereby switch off first NMOS 1114, which may cut off the current path from first NMOS 1114, and the pair of first stage output nodes 1110, 1112 and reduce the overall power consumption of sampler circuit 1100.

In some embodiments, a clocking signal (CLK) may be used to provide timing for an N-bit offset code that may be used to counter the effect of the input referred offset automatically generated by sampler circuit 1100. When CLK=0 or when CLKB=1, sampler circuit 1100 may be in a precharge state, and the first stage outputs $OUT_{P1}$ and $OUT_{N1}$ may be pulled down to ground. When CLK transitions from 0 to 1, first stage output nodes $OUT_{P1}$ and $OUT_{N1}$ may discharge, and whichever node between the two discharges faster may decide the final value of $OUT_P$/$OUT_N$. When an offset code reaches its mid value ($2^{N-1}$), both of the first stage outputs $OUT_{P1}$ and $OUT_{N1}$ may be connected to the same DAC current load, which may make both sides symmetrical. This may also avoid a potential mismatch issue between $OUT_{P1}$ and $OUT_{N1}$ and may result in a lower deadband zone for sampler circuit 1100.

In some embodiments, sampling circuit 1100 may use a 5-bit offset code with N=4. For mid codes [($2^{(N-1)}$)−1] and $2^{(N-1)}$ (15 and 16), DACP<3:0>=0 and DACM<3:0>=0 the switches included in both offset current DACs 1102, 1104 may be configured to be in an OFF state. As such, when receiving mid-codes [($2^{(N-1)}$−1] and $2^{(N-1)}$ (15 and 16), both offset current DACs 1102, 1104 may be in an OFF state and the pair of first stage output nodes 1110, 1112 ($OUT_{P1}$ and $OUT_{N1}$) may not receive any current.

When receiving codes [($2^{(N-1)}$)−1] to 0 (15-0) of the N-bit offset code, second offset current DAC 1104 operatively connected to first stage output node 1110 ($OUT_{P1}$) may be in an ON state, while first offset current DAC 1102 operatively connected to first stage output node 1112 ($OUT_{N1}$) may be in an OFF state. This may cause the time taken for $OUT_{P1}$ to discharge to be faster than the time taken for $OUT_{N1}$ to discharge. Further, when receiving codes $2^{(N-1)}$ to [($2^{N}$)−1] (16-31) of the N-bit offset code, second offset current DAC 1104 operatively connected to $OUT_{N1}$ may be in an ON state, while first offset current DAC 1102 operatively connected to $OUT_{P1}$ may be in an OFF state. This may cause the time taken for $OUT_{N1}$ to discharge to be faster than the time taken for $OUT_{P1}$ to discharge. This difference in discharge times may translate to an input referred offset on sampler circuit 1100, which may be programmed to cancel the offset generated by sampler circuit 1100. Effectively, the structural symmetry of first offset current DAC 1102 and second offset current DAC 1104, may cause the deadband introduced due to sampler circuit 1100 to be functionally negligible.

In some embodiments, an offset control logic may include a pair of NOR gates, the output of which may each be fed to an inverter as an input.

Referring again to FIGS. 4, 6, 10, and 11. Inverted sampler circuits 1000, 1100 may be considered functionally identical to sampler circuits 400, 600 respectively. The only difference may be that where first offset CAPDAC circuit 402 and second offset CAPDAC circuit 404 may be connected to ground and first PMOS transistor 414 may be connected to a voltage source ($V_{DD}$) in sampler circuit 400, in inverted sampler circuit 1000 first offset CAPDAC 1002 and second offset CAPDAC 1004 may be connected to the voltage source ($V_{DD}$) and first PMOS transistor 1014 may be connected to ground. Similarly, inverted sampler circuit 1100 may also be considered to be functionally equivalent to sampler circuit 600. The only difference may be that where first offset current DAC circuit 602 and second offset current DAC circuit 604 may be connected to ground and first PMOS transistor 614 may be connected to a voltage source ($V_{DD}$) in sampler circuit 600, in inverted sampler circuit 1100 first offset current DAC 1102 and second offset current DAC 1104 may be connected to the voltage source ($V_{DD}$) and first NMOS transistor 1114 may be connected to ground. The configurations shown in FIGS. 10 and 11 may result in an inverted polarity within inverted sampler circuits 1000 and 1100 when compared to sampler circuits 400 and 600, but the inverted polarity may not result in any other changes in the operation/functionality of inverted circuits 1000 and 1100.

The sampler architectures disclosed herein may reduce the deadband of the sampler circuit and significantly improve the timing margin of the read path. Further, the use of the sampler architectures disclosed herein may increase the sensitivity of receivers thereby reducing the gain required from the preamplifier. Currently, GDDR7 receivers may include preamplifiers having 3 stages. Use of the sampler architectures disclosed herein may enable a reduction of the number of stages from 3 to 2 and may reduce area and power requirements. The preamplifier may have 3 stages and a decision feedback equalizer (DFE) offset may be introduced in the 2nd stage to get better linearity when compared to introducing a DFE offset in the 3rd stage. With the sampler architectures disclosed herein, the number of stages in a GDDR7 preamplifier may be reduced to 2 thereby reducing the DFE offset settling time and improving DFE performance. Further, with the sampler architecture disclosed herein, the preamplifier may only need 2 stages of differential amplifiers and may make it easier to stabilize the negative feedback loop during auto-zeroing of the GDDR7 Receiver. The sampler architecture disclosed herein may not need periodic calibration and may have good performance with volume-temperature (VT) drift despite not having periodic calibration. This improved performance may simplify system design and avoid the reduction in bandwidth of the system that may occur with periodic calibration.

It will be apparent to those skilled in the art that various modifications and variations may be made in embodiments of the present disclosure without departing from the spirit or scope of the invention. Thus, it is intended that embodiments of the present disclosure cover the modifications and variations of this invention provided they come within the scope of the appended claims and their equivalents.

What is claimed is:

1. A sampler circuit comprising:
   a first positive-channel metal oxide semiconductor (PMOS) or negative-channel metal oxide semiconductor (NMOS) transistor operatively connected to a voltage source and a first output node;
   a cross-coupled PMOS/NMOS pair operatively connected to the first PMOS/NMOS transistor, respectively;
   a pair of first stage output nodes operatively connected to the cross-coupled PMOS/NMOS pair, respectively, wherein the pair of first stage output nodes includes a positive node and a negative node;
   an input differential pair operatively connected to the pair of first stage output nodes;
   an offset current digital-to-analog converter (DAC) operatively connected to a first side of the input differential pair; and
   an offset current DAC replica operatively connected to a second side of the input differential pair.

2. The sampler circuit of claim 1, wherein the pair of first-stage output nodes are configured to be charged to a voltage level equal to the voltage source when a clock signal is zero and the sampler circuit is in a precharge state.

3. The sampler circuit of claim 1 with the first PMOS/NMOS transistor, wherein the offset current DAC and the offset current DAC replica are connected to ground/a voltage source, respectively.

4. The sampler circuit of claim 1, wherein the cross-coupled PMOS/NMOS pair is connected to a pair of cross-coupled NOR/NAND gates including a first NOR/NAND gate and a second NOR/NAND gate, respectively, such that the first NOR/NAND gate takes the positive output node of the pair of first stage output nodes and an output of the second NOR/NAND gate as inputs and the second NOR/NAND gate takes the negative output node of the pair of first stage output nodes and an output of the first NOR/NAND gate as inputs, respectively.

5. The sampler circuit of claim 4, wherein an OR/AND gate is configured to use the output of the first NOR/NAND gate and the output of the second NOR/NAND gate as inputs, respectively, wherein the first output node mirrors the output of the OR/AND gate, such that the first output node is configured to rise to 1/fall to 0 and switch off the first PMOS/NMOS transistor after a delay, respectively.

6. The sampler circuit of claim 5, wherein the pair of first stage output nodes are configured to discharge when a clock signal transitions from 0 to 1, such that whichever of the positive output node or the negative output node of the pair of first stage output nodes discharges faster determines the output of the first output node, and wherein the input differential pair is configured to control the rate of discharge of the positive output node and the negative output node of the pair of first stage output nodes.

7. The sampler circuit of claim 1, wherein the offset current DAC includes a first set of switches configured to introduce an offset that cancels an input referred offset, and wherein a most significant bit (MSB) of an offset code is configured to control the input differential pair to determine which node of the positive output node or the negative output node of the pair of first stage output nodes will receive an offset current.

8. The sampler circuit of claim 1, wherein the offset current DAC replica includes a second set of switches identical to the first set of switches in the offset current DAC, and wherein the second set of switches are in an OFF position, such that the output of the offset current DAC replica and the output of the offset current DAC provide the positive output node and the negative output node of the pair of first stage output nodes with the same capacitive load.

9. A sampler circuit comprising:
   a first positive-channel metal oxide semiconductor (PMOS)/negative-channel metal oxide semiconductor (NMOS) transistor operatively connected to a voltage source and a first output node;

a cross-coupled PMOS/NMOS pair operatively connected to the first PMOS/NMOS transistor, respectively;

a pair of first stage output nodes operatively connected to the cross-coupled PMOS/NMOS pair, respectively, wherein the pair of first stage output nodes includes a positive node and a negative node;

an input differential pair operatively connected to the pair of first stage output nodes;

a first offset capacitive digital-to-analog converter (CAP-DAC) operatively connected to the positive node; and a second offset CAPDAC operatively connected to the negative node.

10. The sampler circuit of claim 9, wherein the pair of first-stage output nodes are configured to be charged to a voltage level equal to the voltage source when a clock signal is zero and the sampler circuit is in a precharge state.

11. The sampler circuit of claim 9 with the first PMOS/NMOS transistor, wherein the first offset CAPDAC and the second offset CAPDAC are connected to ground/a voltage source, respectively.

12. The sampler circuit of claim 9, wherein the cross-coupled PMOS/NMOS pair is connected to a pair of cross-coupled NOR/NAND gates including a first NOR/NAND gate and a second NOR/NAND gate, respectively, such that the first NOR/NAND gate takes the positive output node of the pair of first stage output nodes and an output of the second NOR/NAND gate as inputs and the second NOR/NAND gate takes the negative output node of the pair of first stage output nodes and an output of the first NOR/NAND gate as inputs, respectively.

13. The sampler circuit of claim 12, wherein an OR/AND gate is configured to take the output of the first NOR/NAND gate and the output of the second NOR/NAND gate as inputs, respectively, wherein the first output node mirrors the output of the OR/AND gate, such that the first output node is configured to rise to 1/fall to 0 and switch off the first PMOS/NMOS transistor after a delay, respectively.

14. The sampler circuit of claim 13, wherein the pair of first stage output nodes are configured to discharge when a clock signal transitions from 0 to 1, such that whichever of the positive output node or the negative output node of the pair of first stage output nodes discharges faster determines the output of the first output node, wherein the input differential pair is configured to control the rate of discharge of the positive output node and the negative output node of the pair of first stage output nodes.

15. The sampler circuit of claim 9, wherein both the first and the second offset CAPDACs are configured to receive an N-bit offset code, and both the first and the second offset CAPDACs are in an OFF state when receiving mid-codes $[(2^{(N-1)})-1]$ and $2^{(N-1)}$.

16. The sampler circuit of claim 13 with the first PMOS/NMOS transistor, wherein a capacitance of the positive/negative output node of the pair of first stage output nodes is increased and a capacitance of the negative/positive output node of the pair of first stage output nodes is in an OFF state, respectively, when receiving codes $[(2^{(N-1)}-1]$ to 0 of the N-bit offset code, and wherein a capacitance of the negative/negative output node of the pair of first stage output nodes is increased and a capacitance of the positive/negative output node of the pair of first stage output nodes is in an OFF state, respectively, when receiving codes $2^{(N-1)}$ to $[(2^N)-1]$ of the N-bit offset code.

17. A sampler circuit comprising:

a first positive-channel metal oxide semiconductor (PMOS)/negative-channel metal oxide semiconductor (NMOS) transistor operatively connected to a voltage source and a first output node;

a cross-coupled PMOS/NMOS pair operatively connected to the first PMOS/NMOS transistor, respectively;

a pair of first stage output nodes operatively connected to the cross-coupled PMOS/NMOS pair, respectively, wherein the pair of first stage output nodes includes a positive node and a negative node;

an input differential pair operatively connected to the pair of first stage output nodes;

a first offset current digital-to-analog converter (DAC) operatively connected to the positive node; and a second offset DAC operatively connected to the negative node.

18. The sampler circuit of claim 17, wherein the pair of first-stage output nodes are configured to be charged to a voltage level equal to the voltage source when a clock signal is zero and the sampler circuit is in a precharge state.

19. The sampler circuit of claim 17 with the first PMOS/NMOS transistor, wherein the first offset current DAC and the second offset current DAC are connected to ground/a voltage source, respectively.

20. The sampler circuit of claim 17, wherein the cross-coupled PMOS/NMOS pair is connected to a pair of cross-coupled NOR/NAND gates including a first NOR/NAND gate and a second NOR/NAND gate, respectively, such that the first NOR/NAND gate takes the positive output node of the pair of first stage output nodes and an output of the second NOR/NAND gate as inputs and the second NOR/NAND gate takes the negative output node of the pair of first stage output nodes and an output of the first NOR/NAND gate as inputs, respectively.

21. The sampler circuit of claim 20, wherein an OR/AND gate is configured to take the output of the first NOR/AND gate and the output of the second NOR/AND gate as inputs, respectively, wherein the first output node mirrors the output of the OR/AND gate, such that the first output node is configured to rise to 1/fall to 0 and switch off the first PMOS/NMOS transistor after a delay, respectively, and wherein the pair of first stage output nodes are configured to discharge when a clock signal transitions from 0 to 1, and whichever of the positive output node or the negative output node of the pair of first stage output nodes discharges faster will determine the output of the first output node, wherein the input differential pair is configured to control the rate of discharge of the positive output node and the negative output node of the pair of first stage output nodes.

22. The sampler circuit of claim 17, wherein both the first and the second offset current DACs are configured to receive an N-bit offset code, and both the first and the second offset current DACs are in an OFF state when receiving mid-codes $[(2^{(N-1)})-1]$ and $2^{(N-1)}$.

23. The sampler circuit of claim 22 with the first PMOS/NMOS transistor, wherein the first offset current DAC operatively connected to the positive output node of the pair of first stage output nodes is in an OFF/ON state and the second offset current DAC operatively connected to the negative output node of the pair of first stage output nodes is in an ON/OFF state when receiving codes $[(2^{(N-1)})-1]$ to 0 of the N-bit offset code, respectively, and wherein the second offset current DAC operatively connected to the negative output node of the pair of first stage output nodes is in an OFF/ON state and the first offset current DAC operatively connected to the positive output node of the pair of first stage output nodes is in an ON/OFF state when receiving codes $2^{(N-1)}$ to $[(2^{N})-1]$ of the N-bit offset code, respectively.

* * * * *